(12) United States Patent
Lee et al.

(10) Patent No.: US 7,982,316 B1
(45) Date of Patent: Jul. 19, 2011

(54) SEMICONDUCTOR PACKAGE HAVING A LAND TO ABSORB THERMAL AND MECHANICAL STRESS AND FABRICATING METHOD THEREOF

(75) Inventors: Min Woo Lee, Seoul (KR); Se Woong Cha, Seoul (KR); Jae Hyun Shin, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 652 days.

(21) Appl. No.: 12/025,336

(22) Filed: Feb. 4, 2008

(51) Int. Cl.
*H01L 23/48* (2006.01)
*H01L 23/52* (2006.01)
*H01L 29/40* (2006.01)

(52) U.S. Cl. ........ 257/773; 257/692; 257/737; 257/738; 257/780; 257/786

(58) Field of Classification Search .................. 257/692, 257/737, 738, 780, 669, 773, 785, 786
See application file for complete search history.

(56) References Cited

U.S. PATENT DOCUMENTS

| 5,166,774 | A | 11/1992 | Banerji | |
|---|---|---|---|---|
| 5,518,964 | A * | 5/1996 | DiStefano et al. | 438/113 |
| 5,801,449 | A * | 9/1998 | Dehaine et al. | 257/780 |
| 6,406,938 | B2 * | 6/2002 | Rodenbeck et al. | 438/108 |
| 6,461,892 | B2 * | 10/2002 | Beroz | 438/106 |
| 6,664,621 | B2 * | 12/2003 | Smith et al. | 257/692 |
| 6,965,158 | B2 * | 11/2005 | Smith et al. | 257/669 |
| 2004/0035519 | A1 * | 2/2004 | Beroz et al. | 156/85 |
| 2005/0173805 | A1 * | 8/2005 | Damberg et al. | 257/773 |

* cited by examiner

*Primary Examiner* — Leonardo Andújar
*Assistant Examiner* — Teresa M Arroyo
(74) *Attorney, Agent, or Firm* — Weiss & Moy, P.C.

(57) ABSTRACT

A semiconductor package and method of fabricating has a substrate having conductive patterns formed thereon. A semiconductor die is attached to the substrate. An electrically connecting member is electrically coupled to the semiconductor die and the conductive patterns. A plurality of lands is coupled to the substrate. At least one land is pivotally mounted to the substrate. A first section of the pivotally mounted land is in contact with the substrate. A second section of the pivotally mounted land is floating to form a void area between the substrate and the second section. An encapsulant is used for encapsulating a top surface of the substrate, the semiconductor die, and the electrically connecting member. A solder ball is electrically coupled to each land.

16 Claims, 13 Drawing Sheets

US 7,982,316 B1

SEMICONDUCTOR PACKAGE HAVING A LAND TO ABSORB THERMAL AND MECHANICAL STRESS AND FABRICATING METHOD THEREOF

FIELD OF THE INVENTION

The present invention relates to semiconductor package and, more specifically, to a semiconductor package having a land which is able to absorb thermal and mechanical stress.

DESCRIPTION OF THE RELATED ART

When semiconductor packages are applied to small electronics products and mobile products, board level reliability is considered to be important. However, if the thermal and mechanical stress of a package and a board mounted with the package is applied to a solder connecting surface coupled to a solder ball, the solder connecting surface may be broken. This may cause an electrical open-circuit to be generated which may be a problem in the board level reliability.

In general, the temperature will rise when operating the semiconductor package. This causes the substrate coupled to the solder ball to thermally expand. Furthermore, falling impact when using the mobile equipment or a repetitive mechanical deformation (for example, pushing a keyboard) also affects the reliability. As a result, the mechanically weak solder ball and substrate, that is, the solder connecting surface, is applied with stress so that the solder connecting surface is broken. This may cause an electrical open-circuit to be generated which may be a problem in the board level reliability.

Therefore, a need exists to provide a structure and method to overcome the above problems.

SUMMARY OF THE INVENTION

A semiconductor package and method of fabricating has a substrate having conductive patterns formed thereon. A semiconductor die is attached to the substrate. An electrically connecting member is electrically coupled to the semiconductor die and the conductive patterns. A plurality of lands is coupled to the substrate wherein at least one land is pivotally mounted to the substrate. A first section of the pivotally mounted land is in contact with the substrate. A second section of the pivotally mounted land is floating to form a void area between the substrate and the second section. An encapsulant is used for encapsulating a top surface of the substrate, the semiconductor die, and the electrically connecting member. A solder ball is electrically coupled to each land.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
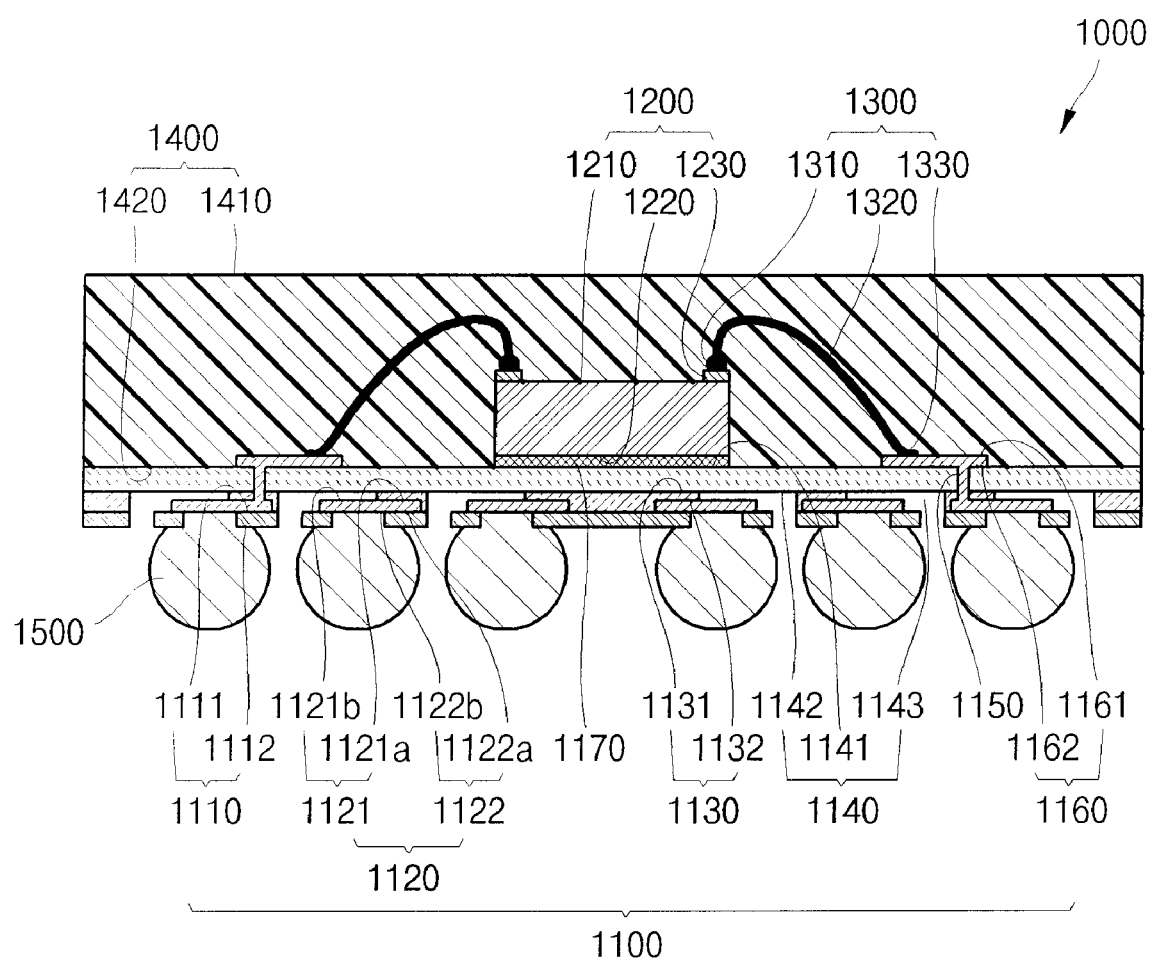
FIG. 1 is a cross-sectional view of a semiconductor package according to an embodiment of the present invention.

Referring to FIG. 1, a cross-sectional view of a semiconductor package 1000 according to an embodiment of the present invention is illustrated. The semiconductor package 1000 may include a substrate 1100, a semiconductor die 1200 attached to the substrate 1100, electrically connecting member 1300 connecting the substrate 1100 with the semiconductor die 1200, an encapsulant 1400 formed on the upper part of the substrate 1100 and the semiconductor die 1200, and solder balls 1500 formed on the substrate 1100.

The substrate 1100 may include a first insulative layer 1110, a land 1120 formed on the upper part of the first insulative layer 1110, a first adhesive 1130 formed on the first insulative layer 1110 and the land 1120, a second insulative layer 1140 formed on the first adhesive 1130, an electrically conductive via 1150 penetrating the second insulative layer 1140, an electrically conductive pattern 1160 coupled to the electrically conductive via 1150, and an adhesive 1170 for attaching the semiconductor die 1200 to the second insulative layer 1140.

The first insulative layer 1110 may be a base film. The material of the base film may be any one selected from thermosetting resins, polyimide, polymer and the equivalent thereof. The listing of the above is given as an example and should not be seen as to limit the scope of the present invention. The first insulative layer 1110 has a first surface 1111 and a second surface 1112 opposite to the first surface 1111. The first surface 1111 of the first insulative layer 1110 is provided with a land 1120 and a first adhesive 1130. The first insulative layer 1110 will have electrical patterns formed thereon. The land 1120 may be coupled to an external circuit board (shown in FIG. 9) by a contact such as a solder ball 1500.

The land 1120 is formed on the first surface 1111 of the first insulative layer 1110. The land 1120 has a first surface 1121 and a second surface 1122 opposite to the first surface 1121. The land 1120 is generally formed of copper. However, this is just one example and should not be seen as to limit the scope of the present invention. The land 1120 is formed on the first surface 1111 of the first insulative layer 1110 and then, is subject to a patterning process, as described below. Also, as shown in FIG. 1, the electrically conductive via 1150 is electrically coupled to the first surface 1121 of the land 1120.

The first surface 1121 of the land 1120 can be divided into a fixed area 1121*a* and a floating area 1121*b*. The fixed area 1121*a* is the area contacting with the first adhesive 1130. In other words, the fixed area 1121*a* is fixed on the second insulative layer 1140 through the first adhesive 1130. Therefore, the fixed area 1121*a* is fixed to support the land 1120 of the semiconductor package 1000.

The floating area 1121*b* is the area that is not contacting the first adhesive 1130 in the first surface 1121 of the land 1120. In other words, the floating area 1121*b* is the area not contacting the second insulative layer 1140 so that the land 1120 may pivot or move about the fixed area 1121*a* as shown subsequently in FIG. 9. Therefore, when thermal and mechanical stress is applied, the stress can be absorbed as the floating area 1121*b* is deformed, and the breakage of the solder connecting surface can be prevented.

In one embodiment, the area of the floating area 1121*b* may be approximately 30% to 80% on the basis of the area of the first surface 1121 of the land 1120.

When the semiconductor package 1000 according to an embodiment of the present invention is applied with the thermal and/or mechanical stress, the stress is absorbed as the floating area 1121*b* is deformed. Consequently, the conventional problem that the solder connecting surface is broken due to the thermal and mechanical to generate an electrical open-circuit can be solved since the floating area 1121*b* absorbs the stress.

As shown in FIG. 1, the second surface 1122 of the land 1120 is the portion electrically coupled to the solder ball 1500. In other words, the land 1120 provides a path that a semiconductor die 1220 coupled to the electrically conductive via 1150 and an external circuit coupled to the solder ball 1500 mutually exchange electrical signals there between.

The second surface 1122 of the land 1120 is differentiated into an insulative area 1122*a* fixed on the first insulative layer 1110 and an electrically conductive portion 1122*b* electrically coupled to the solder ball 1500. The insulative area 1122*a* is the area attached to the first surface 1111 of the first insulative layer 1110. The first insulative layer 1110 has an insulating function as described above so that electrical signals cannot go in and out through the insulative area 1122*a*.

The electrically conductive portion 1122*b* is the portion electrically coupled to the solder ball 1500. Therefore, the external electrical signals can be transferred to the semiconductor die layer 1200 through the electrically conductive portion 1122*b*.

The first adhesive 1130 is applied on the first insulative layer 1110 and the land 1120. More specifically, the first adhesive 1130 is formed on the first surface 1111 of the first insulative layer 1110 and the first surface 1121 of the land 1120.

The first adhesive 1130 may be a UV adhesive. The UV adhesive is a liquid type or a flexible dry film type in a general state. As the material of the UV adhesive used in the first adhesive 1130, the mixture of resin reacting to the ultra violet (hereinafter, referred to as UV) and thermal cure resin are generally used. If the UV is irradiated to the UV adhesive using a UV lamp, the light reaction initiators in the UV adhesive start to react, making it possible to be solidified into a solid adhesive in a shorter time. Therefore, if a mask patterned is used when irradiating the UV, the solidification of the UV adhesive is made only in the desired portion and then, the non-solidified portion can be removed through development. For example, if ONDQ based adhesive receives light, it makes carboxylic acid and the carboxylic acid is resolved in alkaline aqueous solution, making it possible to use alkaline aqueous solution in the development. However, although the material of the first adhesive 1130 is the UV adhesive, the contents of the present invention are not limited thereby.

The thickness of the first adhesive 1130 may be approximately 2 μm to 75 μm. The first adhesive 1130 includes a first surface 1131 and a second surface 1132 opposite to the first surface 1131. The thickness of the first adhesive 1130 denotes the distance from the first surface 1131 to the second surface 1132. The reason why the lower limit of the thickness of the first adhesive 1130 is set to be approximately 2 μm is resulted from that the case of the first adhesive 1130 in a liquid type is considered. If the first adhesive 1130 in a liquid type is formed with the thickness of approximately 2 μm or less, it is difficult to support the stress applied to the first adhesive 1130 bonded to the fixed area 1121*a* when the floating area 1121*b* of the land 1120 is deformed. Consequently, since it is difficult to maintain the bonding of the first adhesive 1130 to the second insulative layer 1140, the first adhesive 1130 may be broken. Also, the reason why the upper limit of the thickness of the first adhesive 1130 is set to be approximately 75 μm is resulted from that the case of the first adhesive 1130 in a dry film type is considered. If the thickness of the first adhesive 1130 is larger than approximately 75 μm, the fixed area 1121*a* is too firmly fixed. Therefore, when the floating area 1121 should be deformed due to the thermal and mechanical stress from outside, the deformation may not be well made. In this case, it is apprehended that the stress is concentrated on the land 1120 to cause breakage so that the upper limit of the thickness of the first adhesive 1130 is limited to be approximately 75 μm.

As shown in FIG. 1, the second insulative layer 1140 is formed on the first surface 1131 of the first adhesive 1130. The second insulative layer 1140 may be a common substrate. The second insulative layer 1140 may be any one selected from common thermosetting resins, polyimide, polymer and the equivalent thereof, but the material thereof is not limited herein.

The second insulative layer 1140 may include a first surface 1141 having electrically conductive pattern 1160 formed thereon, the semiconductor die 1200 attached to the first surface 1141, a second surface 1142 provided with the first adhesive 1130, and a space 1143 formed on the lower of the second surface 1142.

The space 1143 denotes the area formed between the land 1120 and the second insulative layer 1140. More specifically, the space 1143 is the empty or void area between the floating area 1121*b* of the land 1120 and the second surface 1142 of the second insulative layer 1140. In other words, the space 1143 is the area that is generated by not contacting with the floating area 1121*b* of the land 1120 to the second surface 1142 of the second insulative layer 1140.

The space 1143 may be formed at the distance of approximately 200 μm or less. The distance of the space 1143 denotes the distance from the second surface 1142 of the second insulative layer 1140 to the first surface 1121 of the land 1120.

As shown in FIG. 1, the electrically conductive via 1150 is formed by penetrating the second insulative layer 1140. In other words, the electrically conductive via 1150 is formed by penetrating through the first surface 1141 to the second surface 1142 of the second insulative layer 1140 in a vertical direction. The electrically conductive via 1150 may generally be coated with a conductive material such as copper, or the like. The listing of the above materials is given as an example and should not be seen as to limit the scope of the present invention.

The electrically conductive pattern 1160 is formed on the second insulative layer 1140. More specifically, the electrically conductive pattern 1160 is formed on the first surface 1141 of the second insulative layer 1140. The electrically conductive pattern 1160 is electrically coupled to the electrically conductive via 1150. In other words, as shown in FIG. 1, the electrically conductive pattern 1160 is coupled to the land 1120 through the electrically conductive via 1150. The electrically conductive pattern 1160 may use copper or other conductive metals. The listing of the above is given as an example and should not be seen as to limit the scope of the present invention.

The adhesive 1170 is formed on the first surface 1141 of the second insulative layer 1140. The adhesive 1170 attaches the second insulative layer 1140 to the semiconductor die 1200. The material of the adhesive 1170 may be mainly epoxy, adhesive tape, or the equivalent thereof, but the contents of the present invention are not limited to the aforementioned materials. Other adhesives may be used without departing from the spirit and scope of the present invention.

The semiconductor die 1200 is attached to the first surface 1141 of the second insulative layer 1140 by means of the adhesive 1170. The semiconductor die 1200 denotes an integrated circuit for processing electrical signals. Although FIG. 1 shows the case where the semiconductor die 1200 is one, multiple semiconductor dies can be integrated in a stacked shape in some cases, and the contents of the present invention are not limited to the number of the semiconductor die 1200 shown.

As shown in FIG. 1, the semiconductor die 1200 may include a first surface 1210, a second surface 1220 which is opposite to the first surface 1210 and contacts with the adhesive 1170, and a bond pad 1230 formed on the first surface 1210.

The bond pad 1230 is indicated to be formed above the first surface 1210. However, this is to show the connecting relation with the electrically connecting member 1300, and it is obvious to those skilled in the art to which the present invention pertains that the bond pad 1230 can be inwardly formed as compared to the first surface 1210 and thus, the detailed explanation thereof will be omitted.

The electrically connecting member 1300 electrically connects the electrically conductive pattern 1160 to the bond pad 1230. The electrically connecting member 1300 may be any one selected from aluminum, copper, gold or the equivalent thereof, but the present invention is not limited to such material of the electrically connecting member.

As shown in FIG. 1, the electrically connecting member 1300 may be divided into a ball bonding portion 1310, an electrically conductive portion 1320, and a stitch bonding portion 1330.

The ball bonding portion 1310 is the portion electrically coupled to the bond pad 1230, the electrically conductive portion 1320 is the portion to connect the ball bonding portion 1310 to the stitch bonding portion 1330, and the stitch bonding portion 1330 is the portion electrically coupled to the electrically conductive pattern 1160. In other words, the semiconductor die 1200 can be electrically coupled to an external circuit through the electrically connecting member 1300.

As shown in FIG. 1, the encapsulant 1400 is formed on the first surface 1141 of the second insulative layer 1140 and the first surface 1210 of the semiconductor die 1200. Also, the encapsulant 1400 is encapsulating while surrounding the electrically connecting member 1300 inside thereof. In other words, the encapsulant 1400 is encapsulated in order to protect the semiconductor die 1200 and the electrically connecting member 1300 from the external environment. The encapsulant 1400 may be any one selected from common epoxy resin, silicone resin, or the equivalent thereof, but the material of the encapsulant 1400 is not limited to those materials stated above. Other materials may be used without departing from the spirit and scope of the present invention.

As shown in FIG. 1, the encapsulant 1400 may include a first surface 1410 exposed to outside and a second surface 1420 formed to be opposed thereto and contacts with the second insulative layer 1160 and the semiconductor die 1200.

As shown in FIG. 1, the solder ball 1500 is electrically coupled to the electrically conductive portion 1122*b* in the second surface 1122 of the land 1120. The solder ball 1500 is the portion electrically coupled to an external circuit. The material of the solder ball 1500 may be the alloy of lead (Pb), tin (Sn) or silver (Ag), etc., which are generally easy to produce and handle and have low melting points. However, the contents of the present invention are not limited to the above materials for the solder ball 1500.

Also, FIG. 1 shows a structure where the solder balls 1500 is provided with five to every row. However, it is obvious to those skilled in the art to which the present invention pertains that the solder ball 1500 can further be formed at needs, and thus, the contents of the present invention are not limited to the number of the solder ball 1500 shown.

The semiconductor package 1000 according to an embodiment of the present invention includes a floating area 1121*b* on the first surface 1121 of the land 1120. Therefore, the land 1120 pivots or moves about the fixed area 1121*a* as subsequently shown in FIG. 9 and it offsets the thermal and mechanical stress applied to the land 1120. Consequently, the conventional problems that the land is broken and open-circuit is generated can be solved.

In the semiconductor package 1000 according to an embodiment of the present invention, the floating area 1121*b*, which is formed having the space 1143 disposed between itself and the second insulative layer 1140 is deformable. Therefore, differing from the conventional technique, the stress applied to the land 1120 is offset as the floating area 1121*b* is deformed. Therefore, the land 1120 is not broken and the electrical open-circuit is not generated, thereby improving board level reliability.

Figure 2:
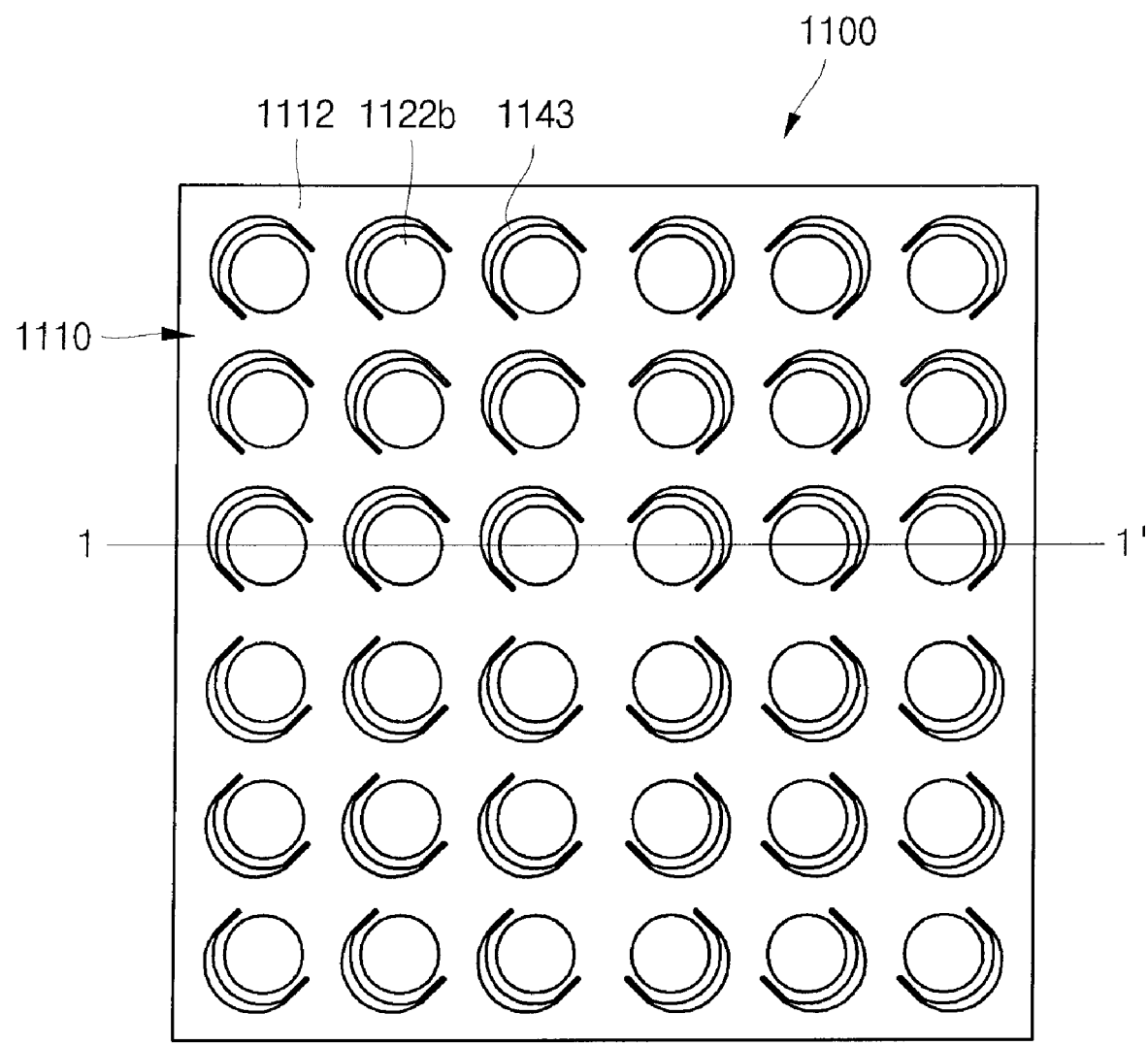
FIG. 2 is a bottom view of a semiconductor package according to an embodiment of the present invention.

Referring to FIG. 2, a substrate in a state where a solder ball is not attached to a semiconductor package according to an embodiment of the present invention is illustrated as a bottom view. In comparison with FIG. 1 and FIG. 2, FIG. 1 is a cross-sectional view taken along the surface 1-1' of FIG. 2.

The substrate 1100 of the semiconductor package 1000 according to an embodiment of the present invention may include a first insulative layer 1110, and the first insulative layer 1110 may include a first surface 1111 and a second surface 1112.

Since a solder ball 1500 is not attached in FIG. 2, the second surface 1112 of the first insulative layer 1110 can be seen. Also, the conductive area 1122*b* and the electrically conductive via 1150 of the land 1120 can be formed on the second surface 1112 provided with a pattern of the first insulative layer 1110.

The material of the substrate 1100, as described above, may be any one selected common thermosetting resins, polyimide, polymer and the equivalent thereof, but the material thereof is not limited herein.

The second surface 1112 of the first insulative layer 1110 denotes the surface formed with the first insulative layer 1110 among the surfaces of the substrate 1100, and as the material of the first insulative layer 1110 may be generally as described above.

The conductive area 1122*b* of the land 1120 is the portion electrically coupled to the solder ball 1500 in the area of the land 1120. The size of the conductive area 1122*b* of the land 1120 is formed depending on the size of the area contacting with the solder ball 1500. The material of the second surface 1122 of the land 1120 may be generally copper. But, the contents of the present invention are not limited to the shape and the material of the second surface 1122 of the land 1120.

The electrically conductive via 1150 is electrically coupled to the second surface 1122 of the land 1120. The material of the electrically conductive via 1150 may be copper. But, the contents of the present invention are not limited to the material of the electrically conductive via 1150.

The space 1143 is formed at the second surface 1112 of the first insulative layer 1110 covering the conductive layer 1122*b* of the land 1120. The space 1143 is formed so as to allow the conductive layer 1122*b* of the land 1120 to move.

Figure 3:
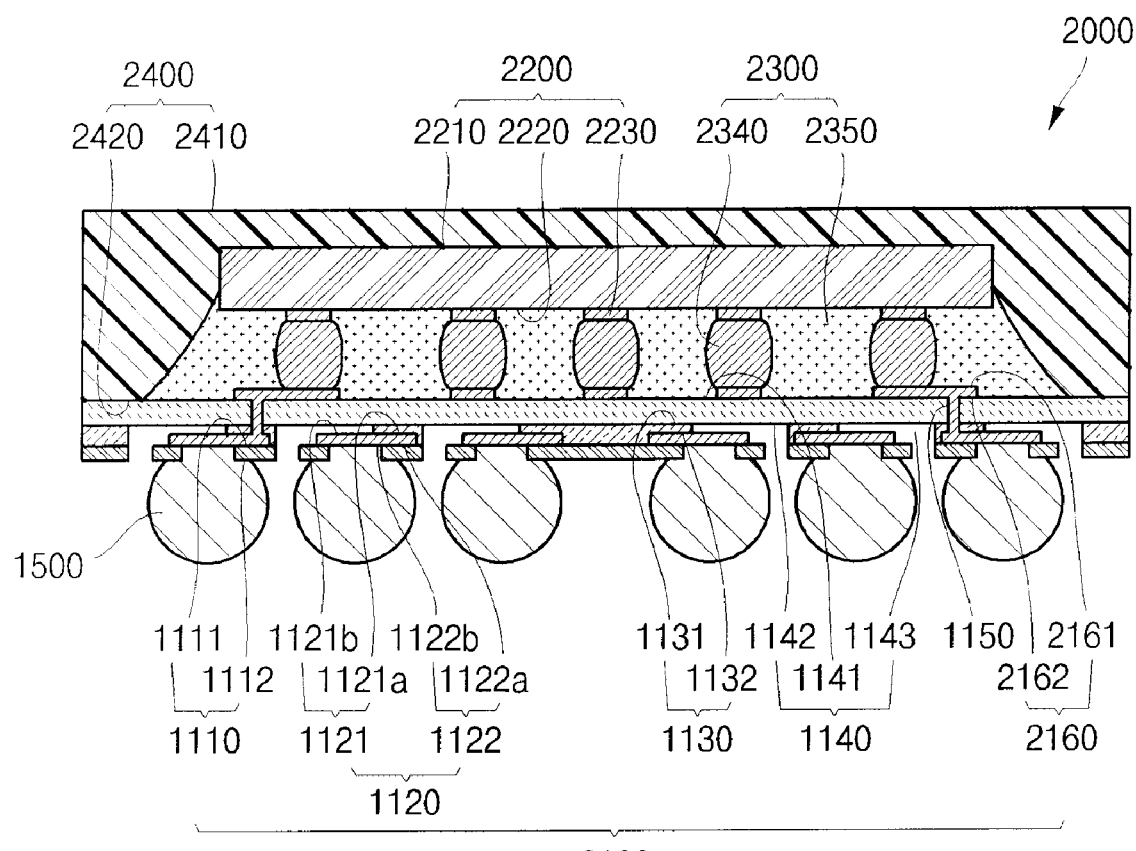
FIG. 3 is a cross-sectional view of a semiconductor package according to another embodiment of the present invention.

Referring to FIG. 3, a cross-sectional view of a semiconductor package according to another embodiment of the present invention is illustrated. FIG. 3 shows what is illustrated in the cross-section taken along line 1-1' of FIG. 2.

For the portions having the same constitution and the operation, the same drawings' reference numerals are given and hereinafter, it will be described with focus on the difference thereof.

As shown in FIG. 3, a semiconductor package 2000 according to another embodiment of the present invention may include a substrate 2100, a semiconductor die 2200 formed on the substrate 2100, an electrically connecting member 2300 electrically connecting the substrate 2100 to the semiconductor die 2200, an encapsulant 2400 formed on the upper of the semiconductor die 2200, and a solder ball 1500 formed on the substrate 2100.

In comparison with FIG. 2 and FIG. 3, the solder ball 1500 is the same as that of the semiconductor package 1000 according to an embodiment of the present invention. As shown in FIG. 3, the substrate 2100 may include a first insulative layer 1110, a land 1120, a first adhesive 1130, a second insulative layer 1140, an electrically conductive via 2150, and an electrically conductive pattern 2160. The electrically conductive via 2150 and the electrically conductive pattern 2160, which are different from the semiconductor package 1000 according to an embodiment of the present invention, will be described.

The electrically conductive via 1150 and the electrically conductive pattern 2160 may be formed even in the area where the semiconductor die 2200 is provided, differing from the semiconductor package 1000 according to an embodiment of the present invention. In other words, the electrically conductive via 1150 and the electrically conductive pattern 2160 are formed in the area corresponding to one surface of the semiconductor die 2200. Therefore, a considerable amount of noise in the electrical signals input and output to and from the semiconductor package 2000 according to another embodiment of the present invention can be removed. The semiconductor die 2200 is the same as the semiconductor package 1000 according to an embodiment of the present invention, except that the electrically conductive via 1150 and the electrically conductive pattern 2160 can be formed even in the area where the semiconductor die 2200 is provided, and thus, the detailed explanation thereof will be omitted.

The semiconductor die 2200 may include a first surface 2210, a second surface 2220, and a bond pad 2230 formed on the second surface 2220. The semiconductor die 2200 of the semiconductor package 2000 according to another embodiment of the present invention is different from the semiconductor die 1200 of the semiconductor package 1000 according to an embodiment of the present invention in that the bond pad 2230 is formed on the second surface 2220 rather than on the first surface 2210. Also, referring to FIG. 3, the bond pad 2230 can be formed over the second surface 2220 of the semiconductor die 2200. Therefore, a plurality of bond pads 2230 can be formed on the co-plane and the same cross-section of the semiconductor die 2200.

As shown in FIG. 3, the electrically connecting member 2300 may include an electrically conductive bump 2340 and an underfill 2350. The electrically conductive bump 2340 electrically connects the bond pad 2230 to an electrically conductive pattern 1160. The electrically conductive bump 2340 generally uses a solder or an adhesive having conductivity. After the electrically conductive bump 2340 is formed on the bond pad 2230 of the semiconductor die 2200, the surface of the semiconductor die 2200 provided with the electrically conductive bump 2340 is bonded to the second insulative layer 1140. In this case, the electrically conductive bump 2340 is electrically coupled to the first surface 2261 of the electrically conductive pattern 2160. The semiconductor package 2000 according to the present invention includes the electrically conductive bump 2340 instead of a wire so that a considerable amount of noise in the electrical signals input and output to and from the semiconductor die 2200 can be removed.

The underfill 2350 is used to reinforce between the second insulative layer 1140 and the semiconductor die 2200. The underfill 2350 generally uses epoxy. But, the contents of the present invention are not limited to the material of the underfill 2350. As the semiconductor die 2200 and the electrically conductive pattern 2160 have different expansion rates due to heat, thereby the impact applied to the electrically conductive bump 2340 is different. The reason to form the underfill 2350 is to relieve the impact. In other words, the underfill 2350 absorbs the impact and reduces the stress applied to the electrically conductive bump 2340, making it possible to increase the lifetime of the semiconductor package 2000.

The encapsulant 2400 is formed on the second surface 1142 of the second insulative layer 1140, while surrounding the second insulative layer 1140, the semiconductor die 2200, and the underfill 2350. The material or the operation of the encapsulant 2400 is the same as the encapsulant 1400 of the semiconductor package 1000 and thus, the detailed explanation thereof will be omitted.

The semiconductor package 2000 according to another embodiment of the present invention includes the electrically conductive bump 2340 as described above. Therefore, the electrically conductive pattern 2160 can be directly formed on the lower of the semiconductor die 2200. Also, a floating area 1121*b* is provided in the land 1120 coupled to the solder ball 1500. Therefore, the semiconductor package 2000 according to another embodiment of the present invention can reduce noise in the electrical signals input and output to and from the semiconductor die 2220, and solve the problem that the land 1120 is broken due to the thermal and mechanical stress.

Figure 4:
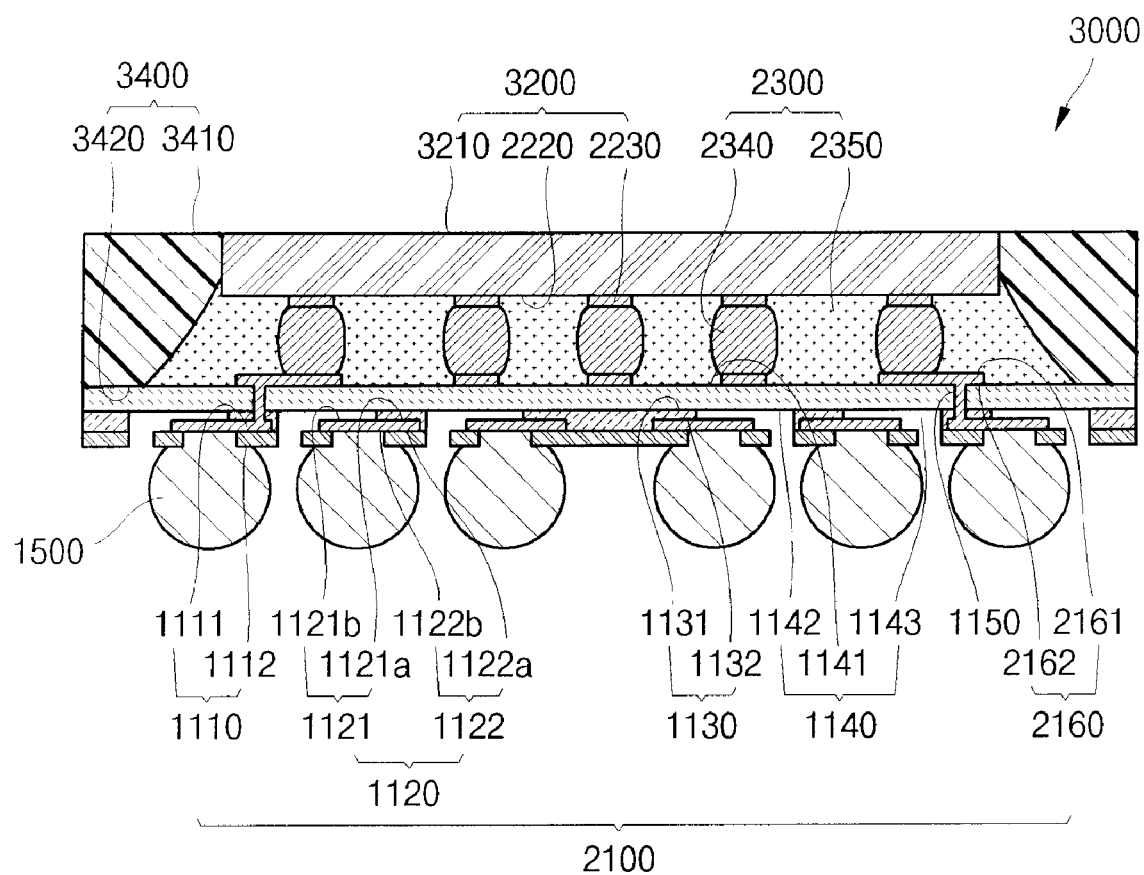
FIG. 4 is a cross-sectional view of a semiconductor package according to still another embodiment of the present invention.

Referring to FIG. 4, a cross-sectional view of a semiconductor package 3000 according to still another embodiment of the present invention is illustrated. For the portions having the same constitution and the operation, the same drawings' reference numerals are given and hereinafter, it will be described with focus on the difference thereof.

As shown in FIG. 4, the semiconductor package 3000 according to still another embodiment of the present invention may include a substrate 2100, a semiconductor die 3200, an electrically connecting member 2300, an encapsulant 3400, and a solder ball 1500.

In comparison with FIG. 3 and FIG. 4, the substrate 2100, the electrically connecting member 2300 and the solder ball 1500 are the same as those of the semiconductor package 2000. As shown in FIG. 4, the semiconductor die 3200 may include a first surface 3210, a second surface 2220, and a bond pad 2230 formed on the second surface 2220.

The semiconductor die 3200 is different from the semiconductor die 2200 of the semiconductor package 2000 as the first surface 3210 is exposed to outside of the semiconductor package 3000. In other words, the first surface 3210 of the semiconductor die 3200 is exposed to outside, while being flush with the first surface 3410 of the encapsulant 3400.

If the first surface 3210 of the semiconductor die 3200 is exposed to outside as shown in the semiconductor package 3000, the heat of the semiconductor die 3200 can be cooled by means of the external air, thereby improving the performance of the semiconductor package 3000.

As shown in FIG. 4, the encapsulant 3400 is formed by including the second insulative layer 1140 and the underfill 2350, etc., inside thereof, while being flush with the first surface 3210 of the semiconductor die 3200. In other words, the encapsulant 3400 is flush with the first surface 3210 of the semiconductor die 3200 to form the outer of the semiconductor package 3000. The material or the function of the encapsulant 3400 is the same as that of the semiconductor package 2000 and thus, the detailed explanation thereof will be omitted.

The semiconductor package 3000 exposes the first surface 3210 of the semiconductor die 3200 to outside as described above. Also, the floating area 1121b is formed in the land 1120 coupled to the solder ball 1500. Therefore, the heat of the semiconductor die 3200 can be easily discharged to outside, and the land 1120 can be protected from the breakage due to the thermal and mechanical stress.

Figure 5:
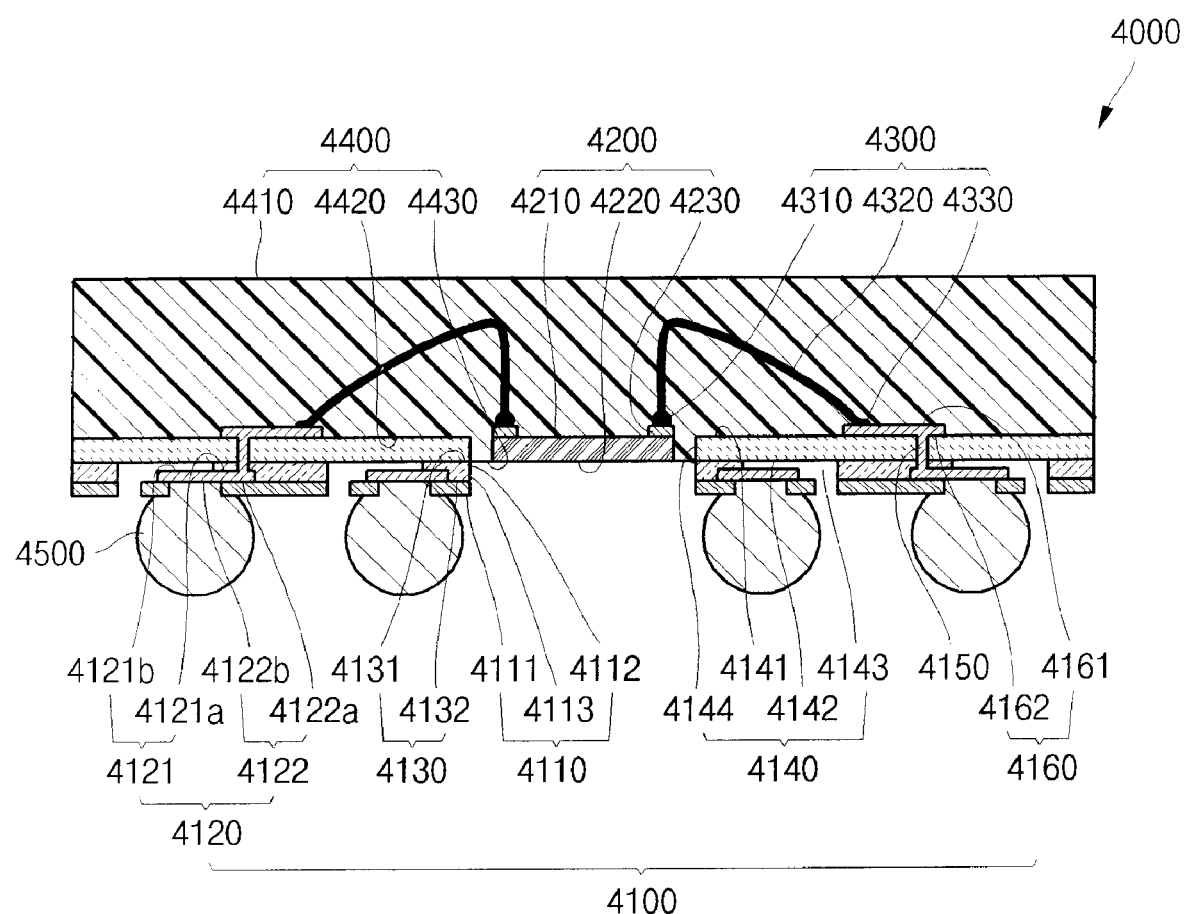
FIG. 5 is a cross-sectional view of a semiconductor package according to still another embodiment of the present invention.

Referring to FIG. 5, a semiconductor package 4000 according to still another embodiment of the present invention may include a substrate 4100, a semiconductor die 4200, an electrically connecting member 4300, an encapsulant 4400, and a solder ball 4500.

As shown in FIG. 5, the substrate 4100 may include a first insulative layer 4100, a land 4120 formed on the first insulative layer 4110, an adhesive 4130 formed on the land 4120, a second insulative layer 4140 on the adhesive 4130, an electrically conductive via 4150 penetrating the second insulative layer 4140, and an electrically conductive pattern 4160 formed on the second insulative layer 4140.

The first insulative layer 4110 generally uses a base film, wherein polyimide is used as the material of the base film. However, other base films may be used without departing from the spirit and scope of the present invention. Also, the first insulative layer 4110 functioning as an insulating layer is the same as the first insulative layer 1110 of the semiconductor package 1000.

However, the first insulative layer 4110 includes an aperture 4113 in the area corresponding to the semiconductor die 4200. More specifically, the semiconductor die 4200 includes a first surface 4210, a second surface 4220, and a bond pad 4230, and the encapsulant 4400 includes a first surface 4410, a second surface 4420, and a third surface 4430. Herein, the aperture 4113 is formed in the area corresponding to the second surface 4220 of the semiconductor die 4200 and the third surface 4430 of the encapsulant 4400 in the areas of the first insulative layer 4110.

The first insulative layer 4110 is provided with the aperture 4113 since the second insulative layer 4140 is also provided with the aperture 4144. The thickness of the entire semiconductor package 4000 may be thinner by positioning the semiconductor die 4200 in the aperture 4144 of the second insulative layer 4140. Any explanation other than this is the same as the first insulative layer 1110 of the semiconductor package 1000 and thus, the detailed explanation thereof will be omitted.

The land 4120 is formed on the first surface 4111 of the first insulative layer 4110. The material of the land 4120 may be copper or the like. The above is given only as an example and should not be seen as to limit the scope of the present invention. Also, the first surface 4121 of the land 4120 is electrically coupled by the electrically conductive via 4150. The first surface 4121 of the land 4120 can be divided into a fixed area 4121a fixed by the adhesive 4130 and a floating area 4121b easily deformable. Since the floating area 4121b is provided, the conventional problems that the land is broken due to the thermal and mechanical stress to generate the electrical open-circuit can be solved. This is the same as the land 1120 of the semiconductor package 1000 according to an embodiment of the present invention. However, differing from the land 1120 of the semiconductor package 1000, the land 4120 is not formed in the area corresponding to the second surface 4220 of the semiconductor die 4220 and the third surface 4430 of the encapsulant 4400. This is the reason that since the solder ball 4500 is not formed in the area, the external circuit and the electrical signals are not input and output.

Referring to FIG. 5, the second surface 4122 of the land 4120 can be divided into an insulative area 4122a and an electrically conductive portion 4122b, but the explanation thereof is the same as the semiconductor package 1000. Therefore, the detailed explanation thereof will be omitted.

The adhesive 4130 is formed on the first insulative layer 4110 and the land 4120. The adhesive 4130 is the same as the first adhesive 1130 of the semiconductor package 1000 according to an embodiment of the present invention, except that the adhesive 4130 is not formed in the area corresponding to the second surface 4222 of the semiconductor die 4200 and the third surface 4430 of the encapsulant 4400. Therefore, the detailed explanation thereof will be omitted.

The second insulative layer 4140 is formed on the first surface 4131 of the adhesive 4130. As shown in FIG. 5, the second insulative layer 4140 may include a first surface 4141, a second surface 4142, a space 4143, and an aperture 4144. However, except for the aperture 4144 formed, the first surface 4141, the second surface 4142, and the space 4143 are the same as those of the semiconductor package 1000 according to an embodiment of the present invention.

The aperture 4144 is formed inside the second insulative layer 4140. More specifically, the aperture 4144 is formed in the area corresponding to the second surface 4220 of the semiconductor die 4200 and the third surface 4430 of the encapsulant 4400. The reason is that the semiconductor die 4200 is formed to be flush with the second insulative layer 4140 in the area of the second insulative layer 4140 provided with the aperture 4144. In the semiconductor package 4000 according to still another embodiment of the present invention, the semiconductor die 4220 is positioned in the aperture 4144 of the second insulative layer 4140. Therefore, the second insulative layer 4140 and the semiconductor die 4200 are formed on one layer so that the thickness of the semiconductor package 4000 may be reduced.

As shown in FIG. 5, the electrically conductive via 4150 is formed by penetrating the second insulative layer 4140. Also, the electrically conductive via 4150 electrically connects the land 4120 to the electrically conductive pattern 4160. The electrically conductive via 4150 may be formed in any area of the second insulative layer 4140 except the area corresponding to the second surface 4220 of the semiconductor die 4200 and the third surface 4430 of the encapsulant 4400. Except for this, the electrically conductive via 4150 is the same as the electrically conductive via 1150 of the semiconductor package 1000. Therefore, the detailed explanation thereof will be omitted.

The electrically conductive pattern 4160 is formed on the first surface 4141 of the second insulative layer 4140. The electrically conductive pattern 4160 is the portion electrically coupled to the semiconductor die 4200. The electrically conductive pattern 4160 may be formed in any area of the first surface 4141 except the portion corresponding to the second surface 4220 of the semiconductor die 4200 and the third surface 4430 of the encapsulant 4400. Except for this, the electrically conductive pattern 4160 is the same as the electrically conductive pattern 4160 of the semiconductor package 1000. Therefore, the detailed explanation thereof will be omitted.

As shown in FIG. 5, the semiconductor die 4200 is formed on the co-plane with the second insulative layer 4140. More specifically, the semiconductor die 4200 may include a first surface 4210, a second surface 4220, and a bond pad 4230 formed on the first surface 4210. Also, the second surface 4220 is positioned on the co-plane with the second surface 4142 of the second insulative layer 4140. In other words, the second surface 4220 of the semiconductor die 4200 is positioned in the area where the aperture 4144 of the second insulative layer 4140 is formed. Consequently, the second surface 4220 of the semiconductor die 4200 is exposed to outside. The reason why the second surface 4220 of the semiconductor die 4200 is exposed to outside is to cool the semiconductor package 400 by allowing the heat thereof to be easily discharged to outside. The semiconductor die 4200 is formed on the aperture 4144 of the second insulative layer 4140. Except for this, the semiconductor die 4220 is the same as the semiconductor die 1200 of the semiconductor package 1000 according to an embodiment of the present invention and thus, the detailed explanation thereof will be omitted.

As shown in FIG. 5, the electrically connecting member 4300 may be a wire. The electrically connecting member 4300 may include a ball bonding portion 4310, an electrically conductive portion 4320, and a stitch bonding portion 4330. The electrically connecting member 4300 electrically connects the electrically conductive pattern 4160 to the bond pad 4230 of the semiconductor die 4200. The electrically conductive pattern 4160 is not formed in the area corresponding to the second surface 4220 of the semiconductor die 4200 and the third surface 4430 of the encapsulant 4400. Therefore, the electrically connecting member 4300 is not electrically coupled to the area corresponding to the second surface 4220 of the semiconductor die 4220 and the third surface 4430 of the encapsulant 4400, either. Except for this, the electrically connecting member 4300 is the same as the electrically connecting member 1300 of the semiconductor package 1000 and thus, the detailed explanation thereof will be omitted.

The encapsulant 4400 is formed on the first surface 4141 of the second insulative layer 4140 and the first surface 4210 of the semiconductor die 4200. As shown in FIG. 5, the encapsulant 4400 may include a first surface 4410 exposed to the outside, a second surface 4420 which contacts with the first surface 4141 of the second insulative layer 4140 and the first surface 4210 of the semiconductor die 4200, and a third surface 4430 being flush with the second surface 4142 of the second insulative layer 4140 to be exposed to outside.

The first surface 4410 and the second surface 4420 of the encapsulant 4400 are the same as the first surface 1410 and the second surface 1420 of the encapsulant 1400 in the semiconductor package 1000 as previously described.

As shown in FIG. 5, the third surface 4430 of the encapsulant 4400 fills the area where the aperture 4144 of the second insulative layer 4140 is formed. In other words, the semiconductor die 4200 is positioned on the aperture 4144 of the second insulative layer 4140, and then the encapsulant 4400 is formed so that the semiconductor die 4200 is fixed. The aperture 4144 is slightly larger then the semiconductor die 4200. Thus a space is formed around the semiconductor die 4200. The space is filled with the encapsulant 4400. Therefore, the third surface 4430 of the encapsulant 4400 is exposed to outside. Also, the third surface 4430 of the encapsulant 4400 is flush with the second surface 4142 of the second insulative layer 4140 and the second surface 4220 of the semiconductor die 4200.

As described above, the encapsulant 4400 is placed in the aperture 4144 of the second insulative layer 4140. Except for this, the encapsulant 4400 is the same as the encapsulant 1400 of the semiconductor package 1000. Therefore, the detailed explanation thereof will be omitted.

The solder ball 4500 is formed on the electrically conductive portion 4122*b* in the second surface 4122 of the land 4120. The solder ball 4500 is the portion electrically coupled to outside. The solder ball 4500 is not formed in the area corresponding to the area where the semiconductor die 4200 is positioned. Except for this, the solder ball 4500 is the same as the solder ball 1500 of the semiconductor package 1000. Therefore, the detailed explanation thereof will be omitted.

As described above, in the semiconductor package 4000, the semiconductor die 4200 is positioned in the aperture 4144 of the second insulative layer 4140. Also, the space 4143 is formed between the first surface 4121 of the land 4120 and the second surface 4142 of the second insulative layer 4140. Therefore, the semiconductor package 4000 according to still another embodiment of the present invention can rapidly cool the heat of the semiconductor die 4200. Furthermore, the conventional problem that the land 4120 is broken to generate an electrical open-circuit can be solved.

Figure 6:
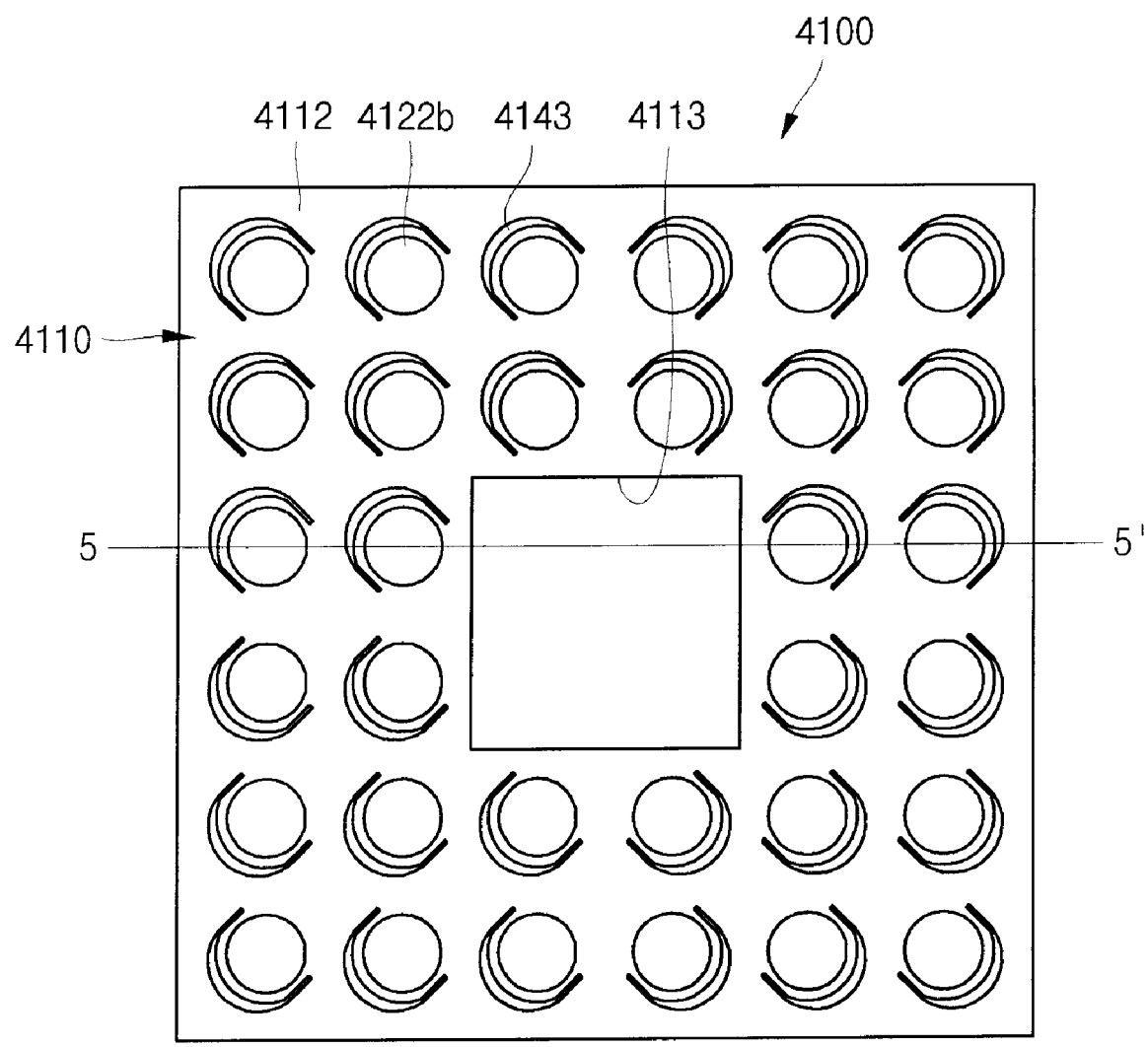
FIG. 6 is a bottom view of a semiconductor package according to still another embodiment of the present invention.

Referring to FIG. 6, a substrate 4100 in a state where a solder ball 4500 is not attached to a semiconductor package 4000 according to still another embodiment of the present invention is illustrated as a bottom view. Also, in comparison with FIG. 5 and FIG. 6, FIG. 5 is a cross-sectional view taken along lines 5-5' of FIG. 6 of the semiconductor package 4000.

As shown in FIG. 6, since the solder ball 4500 is not attached, the second surface 4112 of the first insulative layer 4110 can be seen. Also, the second surface 4112 of the first insulative layer 4110 is provided with the aperture 4113, and the conductive area 4122*b* and the electrically conductive via 4150 of the land 4120.

The second surface 4112 of the first insulative layer 4110 denotes the surface formed with the first insulative layer 4110 among the surfaces of the substrate 4100.

The aperture 4113 of the first insulative layer 4110 is formed in the area corresponding to the second surface 4220 of the semiconductor die 4200 and the third surface 4430 of the encapsulant 4400 in the second surface 4112 of the first insulative layer 4110. The reason why the aperture 4113 is formed inside the second surface 4112 of the first insulative layer 4110 is that the semiconductor die 4200 is to be positioned in the area as described above.

The conductive area 4122*b* of the land 4120 is the portion electrically coupled to the solder ball 4500 in the area of the land 4120. The material of the second surface 4122 of the land 4120 may be copper having excellent electrical conductivity. However, the land 4120 is not formed in the portion provided with the aperture 4113 in the area of the second surface 4112 of the first insulative layer 4110. Therefore, the conductive area 4122b of the land 4120 is not formed, either. In other words, the land 4120 is not formed in the area where the second surface 4220 of the semiconductor die 4200 and the third surface 4430 of the encapsulant 4400 are formed.

The electrically conductive via 4150 is electrically coupled to the second surface 4120 of the land 4120 and generally using copper, etc., is the same as that of the semiconductor package 1000. However, the electrically conductive via 4150 is not formed in the portion provided with the aperture 4113 in the second surface 4112 of the first insulative layer 4110.

Figure 7:
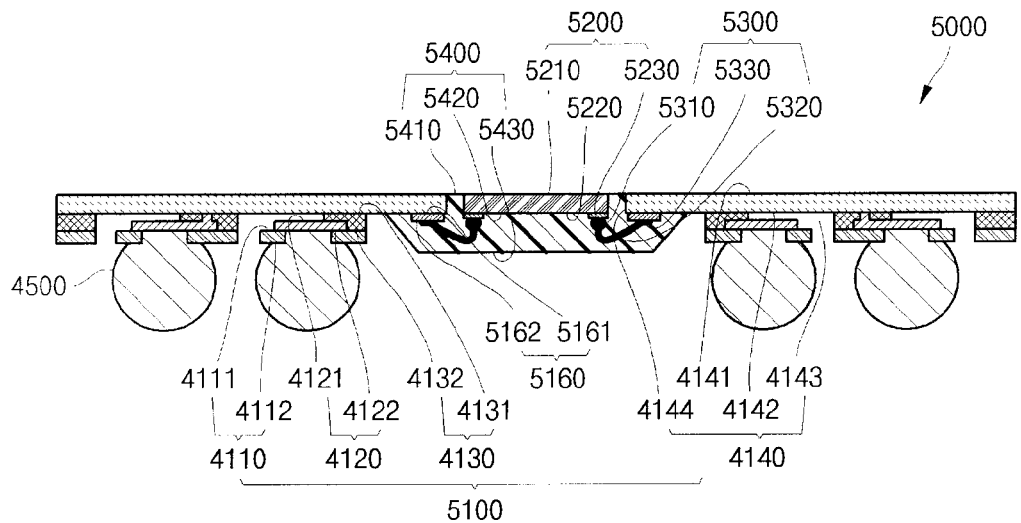
FIG. 7 is a cross-sectional view of a semiconductor package according to still another embodiment of the present invention.

Referring to FIG. 7, a cross-sectional view of a semiconductor package 5000 according to still another embodiment of the present invention is illustrated. The semiconductor package 5000 is the same as the semiconductor package 4000 in view of the surface shape provided with a solder ball 4500 and thus, FIG. 7 shows what is illustrated in the cross-section taken along line 5-5' of FIG. 6.

For the portions having the same constitution and the operation, the same drawings' reference numerals are given and hereinafter, it will be described with focus on the difference thereof.

As shown in FIG. 7, the semiconductor package 5000 according to still another embodiment of the present invention may include a substrate 5100, a semiconductor die 5200, an electrically connecting member 5300, an encapsulant 5400, and a solder ball 4500. In comparison with FIG. 5 and FIG. 7, the solder ball 4500 is the same as that of the semiconductor package 4000 as previously described.

The substrate 5100 may include a first insulative layer 4110, a land 4120, an adhesive 4130, a second insulative layer 4140, and an electrically conductive pattern 5160. In other words, differing form the semiconductor package 4000 according to still another embodiment of the present invention, the substrate 5100 does not include a separate electrically conductive via.

The electrically conductive pattern 5160 is formed on the second surface 4142 of the second insulative layer 4140. Differing form the semiconductor package 4000, the electrically conductive via does not penetrate the second insulative layer 4140. Therefore, the electrically conductive pattern 5160 should be formed on the second surface 4142 of the second insulative layer 4140 before the second insulative layer 4140 is bonded to the adhesive 4130. The land 4120 is electrically coupled to the electrically conductive pattern 5160. However, differing from the semiconductor package 4000, the land 4120 is directly coupled to the electrically conductive pattern 5160 rather than through the electrically conductive via. In FIG. 7, the electrically conductive pattern 5160 coupled to the land 4120 is illustrated to be spaced from the electrically conductive pattern 5160 coupled to the electrically connecting member 5300. However, this is the reason that the cross-section taken along lines 5-5' of FIG. 6 is illustrated, but practically they are mutually coupled. The electrically conductive pattern 5160 is formed on the second surface 4142 of the second insulative layer 4140. Except for this, the electrically conductive pattern 5160 is the same as the electrically conductive pattern 4160 of the semiconductor package 4000 and thus, the detailed explanation thereof will be omitted.

The semiconductor die 5200 is positioned being flush with the second insulative layer 4140. More specifically, the semiconductor die 5200 includes a first surface 5210, a second surface 5220, and a bond pad 5230 formed on the second surface 5220. The first surface 5210 is flush with the first surface 4141 of the second insulative layer 4140. This is the difference between the semiconductor die 5200 and the semiconductor die 4200 of the semiconductor package 4000. In other words, the first surface 5210 of the semiconductor die 5200 is exposed to the outside together with the first surface 4141 of the second insulative layer 4140.

As shown in FIG. 7, the first surface 5210 of the semiconductor die 5200 is exposed to outside, while being flush with the first surface 4141 of the second insulative layer 4140. Differing from the semiconductor package 4000, the bond pad 5230 is not formed on the first surface 5210 of the semiconductor die 5200.

Differing from the semiconductor package 4000, the second surface 5220 of the semiconductor die 5200 includes the bond pad 5230. Also, the encapsulant 5400 is formed, while surrounding the outside thereof, on the second surface 5220 of the semiconductor die 5200.

The bond pad 5230 of the semiconductor die 5200 is formed on the second surface 5220 of the semiconductor die 5200. Also, the electrically connecting member 5300 is coupled to the bond pad 5230.

As shown in FIG. 7, the electrically connecting member 5300 electrically connects the electrically conductive pattern 5160 to the bond pad 5230. The electrically connecting member 5300 may be a wire. The electrically connecting member 5300 may include a ball bonding portion 5310, an electrically conductive portion 5320, and a stitch bonding portion 5330. Also, except for the ball bonding portion 5310, the electrically conductive portion 5320, and the stitch bonding portion 5330 are formed in the direction of the second surface 4142 of the second insulative layer 4140, the electrically connecting member 5300 is the same as that of the semiconductor package 4000. Therefore, the detailed explanation thereof will be omitted.

The encapsulant 5400 is formed in the area not provided with the solder ball 4500 in the second surface 4142 of the second insulative layer 4140. Referring to FIG. 7, the encapsulant 5400 is formed including the electrically conductive pattern 5160 and the electrically connecting member 5300 in the inside thereof. Also, the encapsulant 5400 is formed on the second surface 4142 of the second insulative layer 4140 and the second surface 5220 of the semiconductor die 5200. The encapsulant 5400 may include a first surface 5410, a second surface 5420, and a third surface 5430.

The first surface 5410 of the encapsulant 5400 is formed between the first surface 4141 of the second insulative layer 4140 and the first surface 5210 of the semiconductor die 5200. An aperture 4144 is formed on the second insulative layer 4140, and the semiconductor die 5200 is formed on the aperture 4144. Consequently, the encapsulant 5400 is filled between the second insulative layer 4140 and the semiconductor die 5200. Therefore, the first surface 5410 of the encapsulant 5400 is exposed to outside.

The second surface 5420 of the encapsulant 5400 is the surface contacts with the second surface 4142 of the second insulative layer 4140, the electrically conductive pattern 5160, and the second surface 5220 of the semiconductor die 5200. The encapsulant 5400 is formed in the direction of the second surface 4142 of the second insulative layer 4140. Therefore, the second surface of the encapsulant 5400 is also formed in the direction of the second surface 4142 of the second insulative layer 4140.

The third surface 5430 of the encapsulant 5400 is formed in the direction of the second surface 4142 of the second insulative layer 4140 and is exposed to the outside. In other words, the third surface 5430 of the encapsulant 5400 is formed in the direction that the solder ball 4500 is formed. Consequently, the solder ball 4500 is not formed in the area where the third surface 5430 of the encapsulant 5400 is formed.

In the semiconductor package 5000, the semiconductor die 5220 is formed being flush with the second insulative layer 4140. Also, the encapsulant 5400 is formed on the second surface 4142 of the second insulative layer 4140. The land 4120 coupled to the solder ball 4500 is provided with the floating area 4121b. Therefore, the thickness of the semiconductor package 5000 can be thinly formed. Also, the heat of the semiconductor die 5200 is easily discharged to outside and the problems with issues with the broken lands due to the thermal and mechanical stress can be solved.

Figure 8:
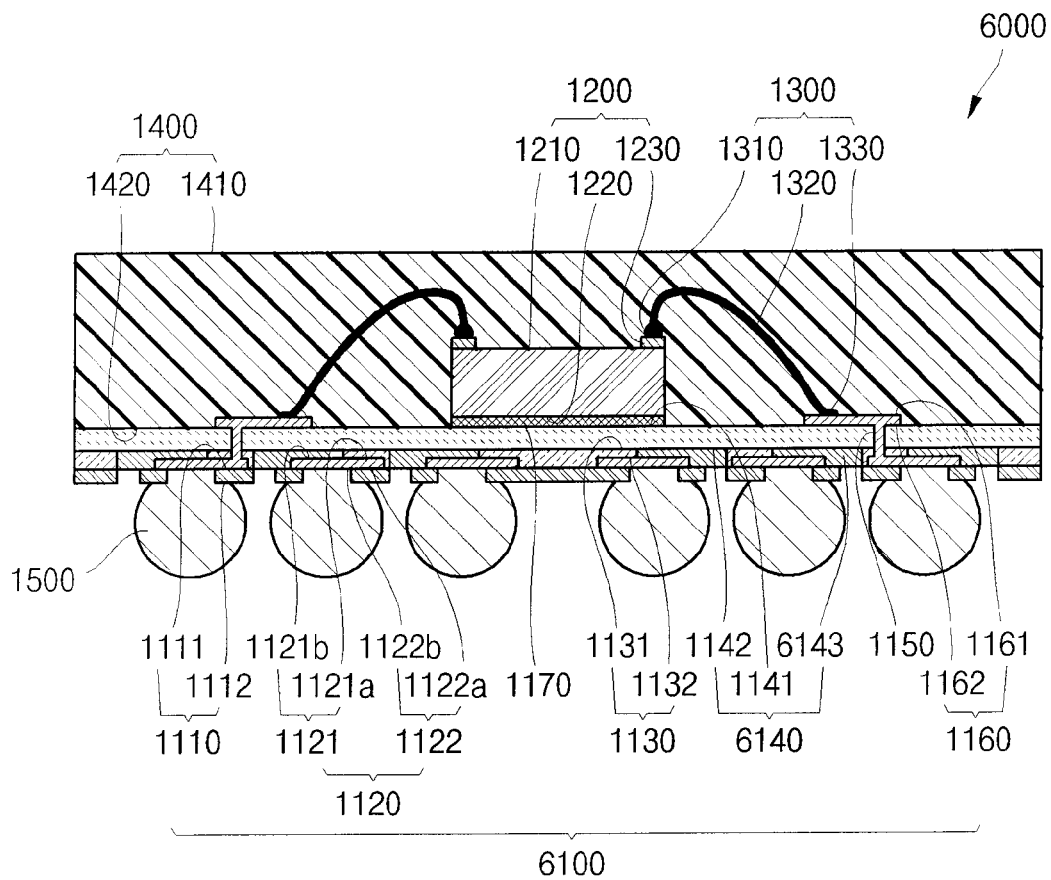
FIG. 8 is a cross-sectional view of a semiconductor package according to still another embodiment of the present invention.

Referring to FIG. 8, a semiconductor package 6000 may include a substrate 6100, a semiconductor die 1200, an electrically connecting member 1300, an encapsulant 1400 and a solder ball 1500. For the portions having the same constitution and the operation, the same drawings' reference numerals are given and hereinafter, it will be described with focus on the difference thereof.

The substrate 6100 may include a first insulative layer 1110, a land 1120, an adhesive 6140, an electrically conductive via 1150 and an electrically conductive pattern 1160.

The second insulative layer 6140 may include the first surface 1141, the second surface 1142 and a filling adhesive 6143 formed at the second surface 1142.

The filling adhesive 6143 corresponds with the space 1143 of a semiconductor package 1000 according to an embodiment of the present invention and fill the area occupied with the space 1143. But some area of the filling adhesive 6143 is formed with materials of low viscosity. So, the land 1120 can move freely in spite of the filling adhesive 6143. Consequently, the semiconductor package 6000 according to an embodiment of the present invention can prevent the land 1120 from being destructed by stress by moving freely.

Figure 9:
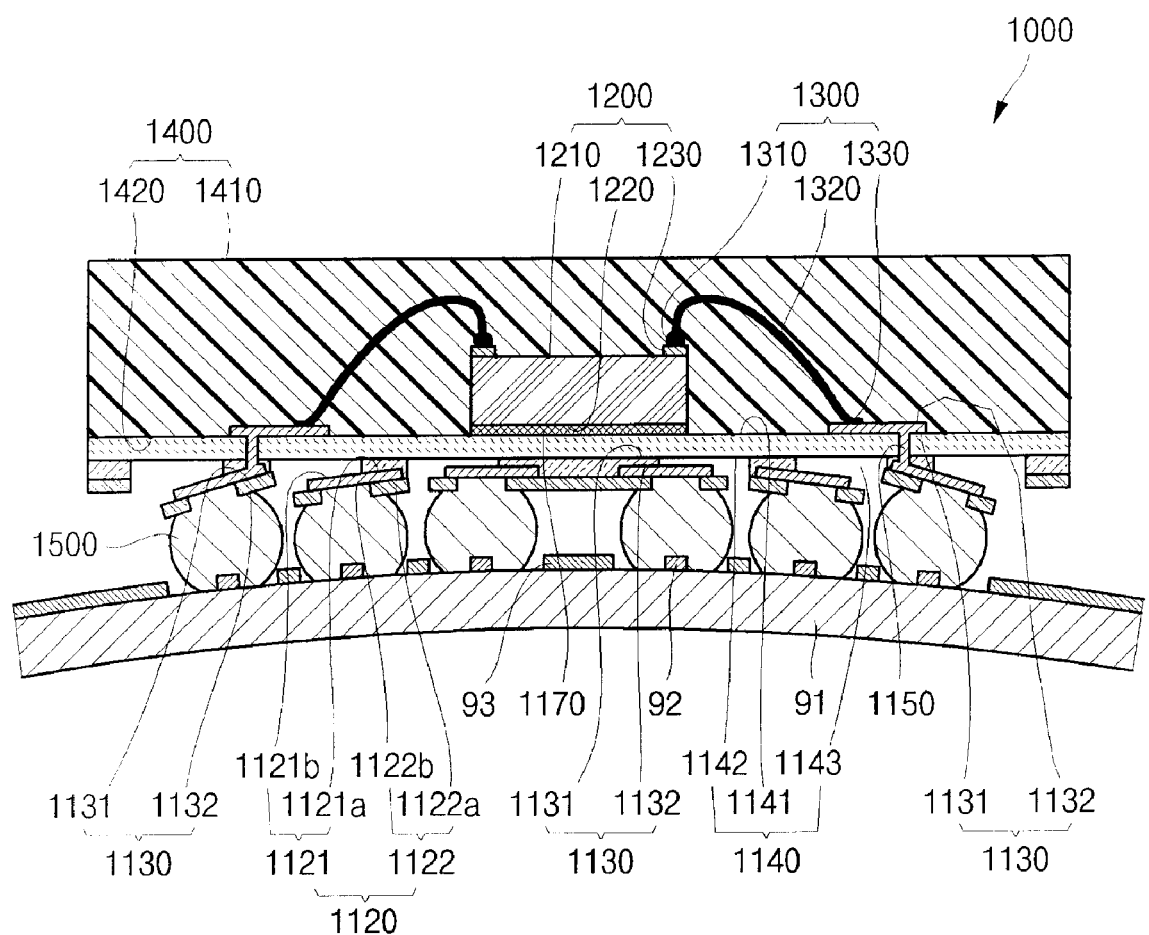
FIG. 9 is a cross-sectional view of a semiconductor package coupled with a substrate.

Hereinafter, operation of the semiconductor package 1000 coupled with an external substrate is described. Referring to FIG. 9, the semiconductor package 1000 according to an embodiment of the present invention is formed on the substrate 91. The substrate 91 may be a printed circuit board, or the like.

At the upper part of the substrate 91, the electrically conductive pattern 92 and the solder mask 93 are formed. The solder ball 1500 of the semiconductor package 1000 according to an embodiment of the present invention may cover the electrically conductive pattern 92 and is electrically coupled with the electrically conductive pattern 92. The solder mask 93 is formed on the substrate 91 and may prevent the solder balls 1500 from being electrically short each other.

Referring to FIG. 9, the substrate 91 and the semiconductor package 1000 can be warped by stresses to include temperature stress and other mechanical stresses. For example, thermal mismatch between the semiconductor package 1000 and the substrate 91 may cause the temperature stress. But it is possible to compensate for the stress by allowing the land 1120 to move freely. Thus, the land 1120 can pivot to compensate for movement between the semiconductor package 1000 and the substrate 91. As may be seen in FIG. 9, in accordance with one embodiment, when the substrate 91 warps, the compensatory movement of the land 1120 is greater at a periphery of the semiconductor package 1000 than at the center of the semiconductor package 1000. Furthermore, this compensatory movement allows the semiconductor package 1000 to remain substantially planar even though the substrate 91 exhibits warpage.

Also, although not shown, it is considerable that the semiconductor package 1000 according to an embodiment of the present invention is warped at the condition the external substrate 91 is maintained flatly. But here as elsewhere the stress is diminished because the land 1120 can move freely. Consequently, the destruction of the land 1120 can be prevented.

Referring to FIGS. 10A to 10K, they are cross-sectional views for explaining the method of fabricating the semiconductor package 1000.

Referring to FIGS. 10A to 10K, cross-sectional views are shown for explaining the method of fabricating the semiconductor package 1000 according to an embodiment of the present invention.

Figure 10A:
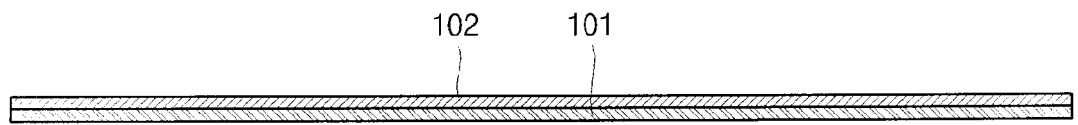
FIGS. 10A to 10K are cross-sectional views of a fabricating method of a semiconductor according to an embodiment of the present invention.

As shown in FIG. 10A, a film layer 101 is provided, and a metal layer 102 is formed on the film layer 101. The film layer 101 may be a base film and the base film is generally formed using polyimide. The material of the metal layer 102 may be copper. However, the material of the film layer 101 and the metal layer 102 of the present invention are not limited to thereof. Other materials may be used without departing from the spirit and scope of the present invention.

Figure 10B:
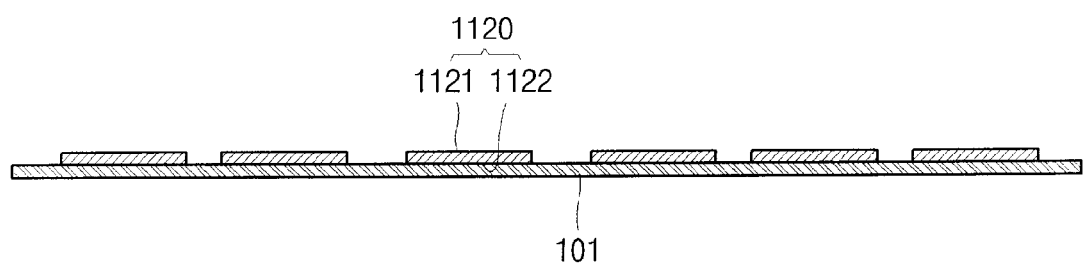

As shown in FIG. 10B, the metal layer 102 is patterned using a photolithographic process and a land 1120 is formed. The land 1120 can be formed with regular intervals independently. So, the land 1120 can input and output electrical signals independently through the patterning, respectively.

Figure 10C:
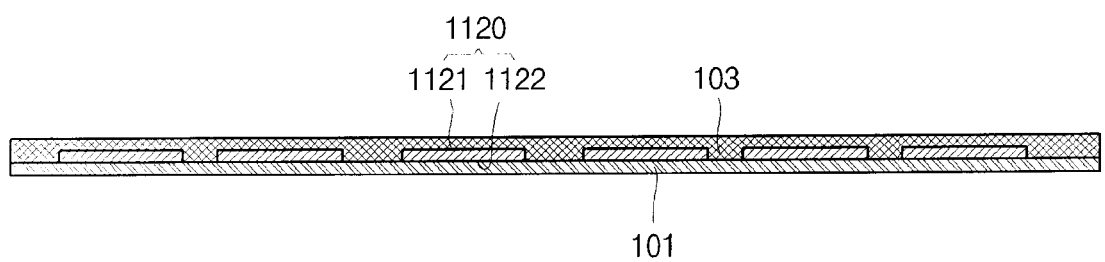

Subsequently, as shown in FIG. 10C, an adhesive 103 is applied. As shown in FIG. 10C, the adhesive 103 is wholly applied to the film layer 101 and the first surface 1121 of the land 1120. The adhesive 103 may be a UV adhesive. The material of the UV adhesive may be the mixture of resin reacting to the ultra violet (UV) and thermal cure resin.

Figure 10D:
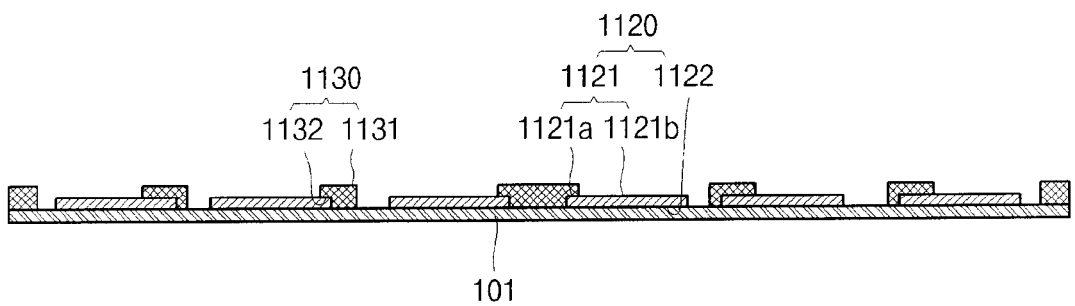

Subsequently, as shown in FIG. 10D, the adhesive 103 is made by development. The UV adhesive applicable as the first adhesive 1130 has two types in its characteristics, i.e., a positive type where the portion not receiving light is solidified, and a negative type where the portion receiving light is solidified, when UV is irradiated. Also, in the semiconductor package 1000 according to the present invention, both types thereof are possible. As described above, if ONDQ based UV adhesive is used, it makes carboxylic acid when the ONDQ based UV adhesive receives light and the carboxylic acid is resolved in alkaline aqueous solution. Therefore, it is possible to use alkaline aqueous solution in the development. The first adhesive 1130 can be formed by developing the adhesive 1130.

Figure 10E:
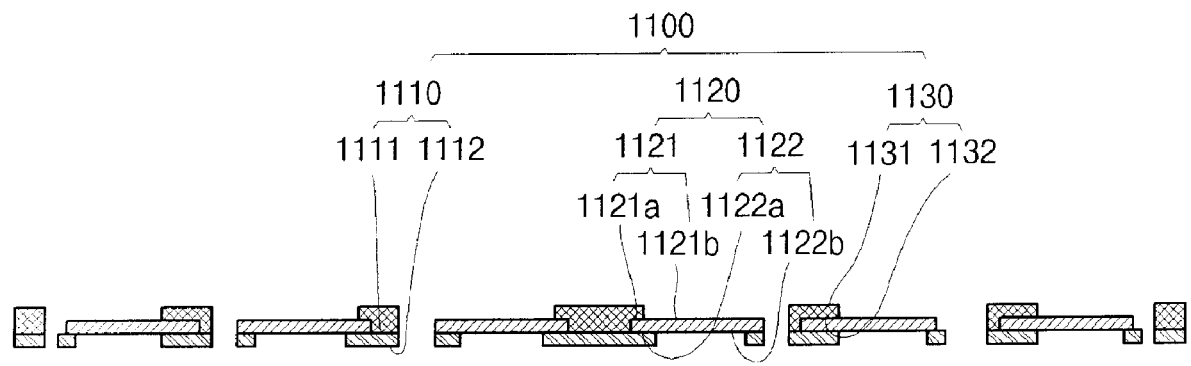

As shown in FIG. 10E, the first insulative layer 1110 is formed by patterning the film layer 101. The film layer 101 can be patterned by etching of the photolithographic process. Also, the film layer 101 is patterned by punching process. The second surface 1122 of the land 1120 is exposed by means of the forming the first insulative layer 1110, it can be electrically coupled to the solder ball 1500.

Figure 10F:
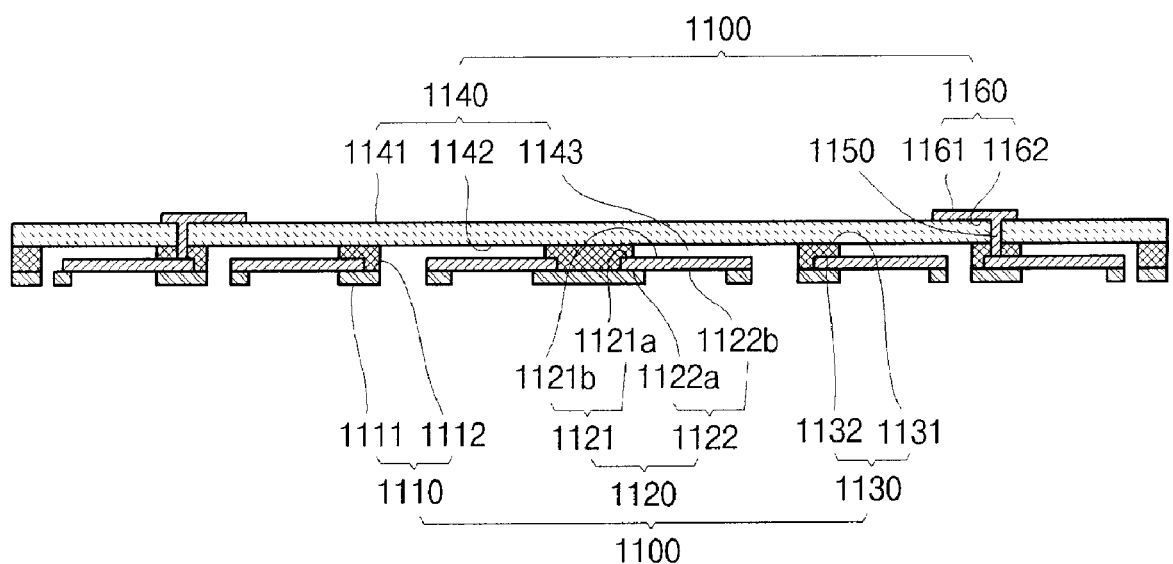

As shown in FIG. 10F, the first surface 1131 of the first adhesive 1130 is provided with a second insulative layer 1140. A dielectric material layer is attached to the first adhesive 1130 to forming the second insulative layer 1140. The dielectric material layer may be any one of selected from common thermosetting resins, polyimide, polymer and the equivalent thereof.

The dielectric material layer can be formed to the second insulative layer 1140 through the process of forming the via hole penetrating the dielectric material. Subsequently, a conductive material is formed to the inner of the via hole and to the first surface 1141 of the second insulative layer 1140.

The electrically conductive via 1150 and the electrically conductive pattern 1160 is formed by patterning the conductive material. The electrically conductive pattern 1160 is formed the first surface 1141 of the second insulative layer 1140.

Figure 10G:
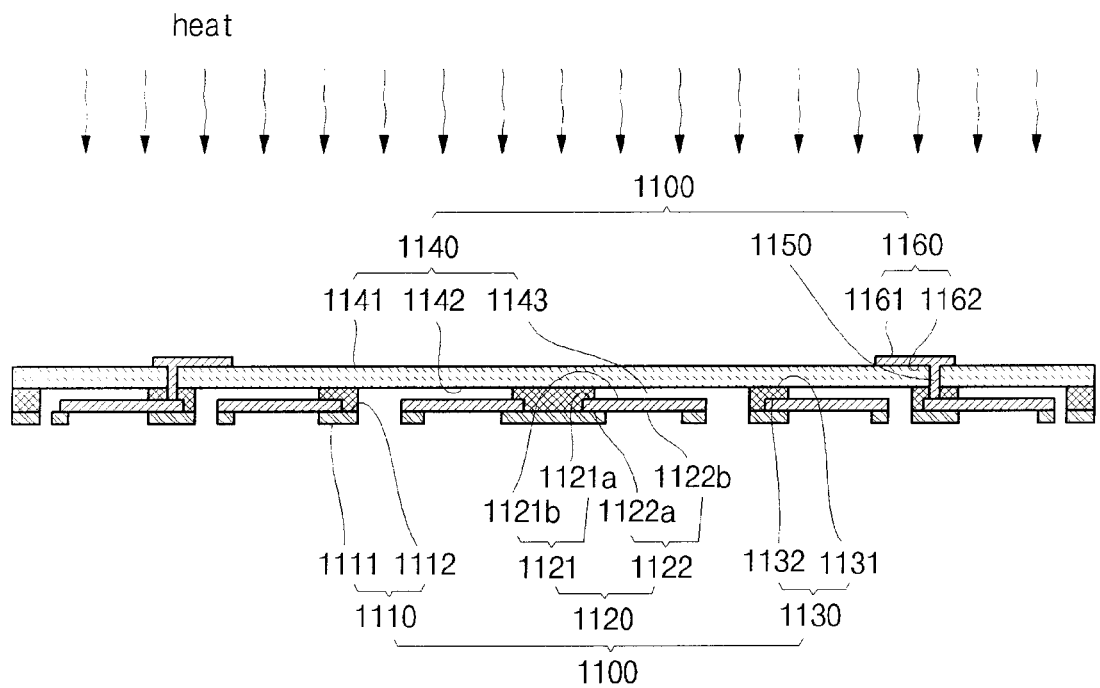

Subsequently, as shown in FIG. 10G, the curing process of thermally curing the first adhesive 1130 is made. As described above, the first adhesive 1130 may use the UV adhesive. Also, the UV adhesive may be the mixture of resin reacting to the ultra violet (UV) and thermal cure resin. Therefore, when curing the first adhesive 1130, the thermal curing process is used. Also, the temperature and the time required in the thermal curing are determined depending on the sorts and the amounts of the thermal cure resin.

Figure 10H:
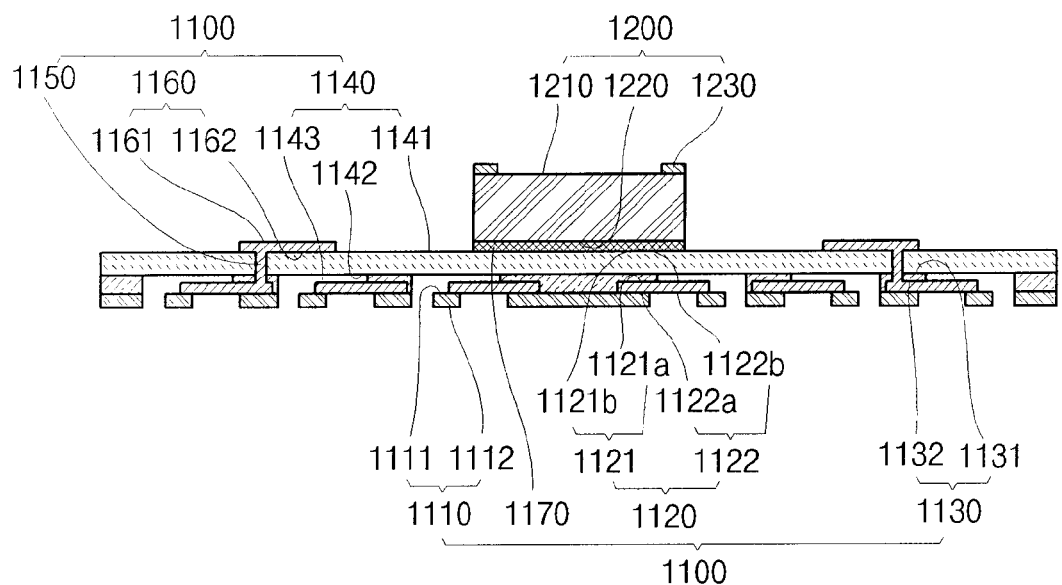

Subsequently, as shown in FIG. 10H, the semiconductor die 1200 is bonded to the first surface 1141 of the second insulative layer 1140. An adhesive 1170 is first applied on the semiconductor package 1000 according to an embodiment of the present invention. As described above, the first adhesive 1170 may be a liquid type or a dry film type.

The semiconductor die 1200 is placed on the adhesive 1170. Referring to FIG. 10H, the semiconductor die 1200 includes a first surface 1210, a second surface 1220 bonded to the adhesive 1170, and a bond pad 1230 formed on the first surface 1210.

Figure 10I:
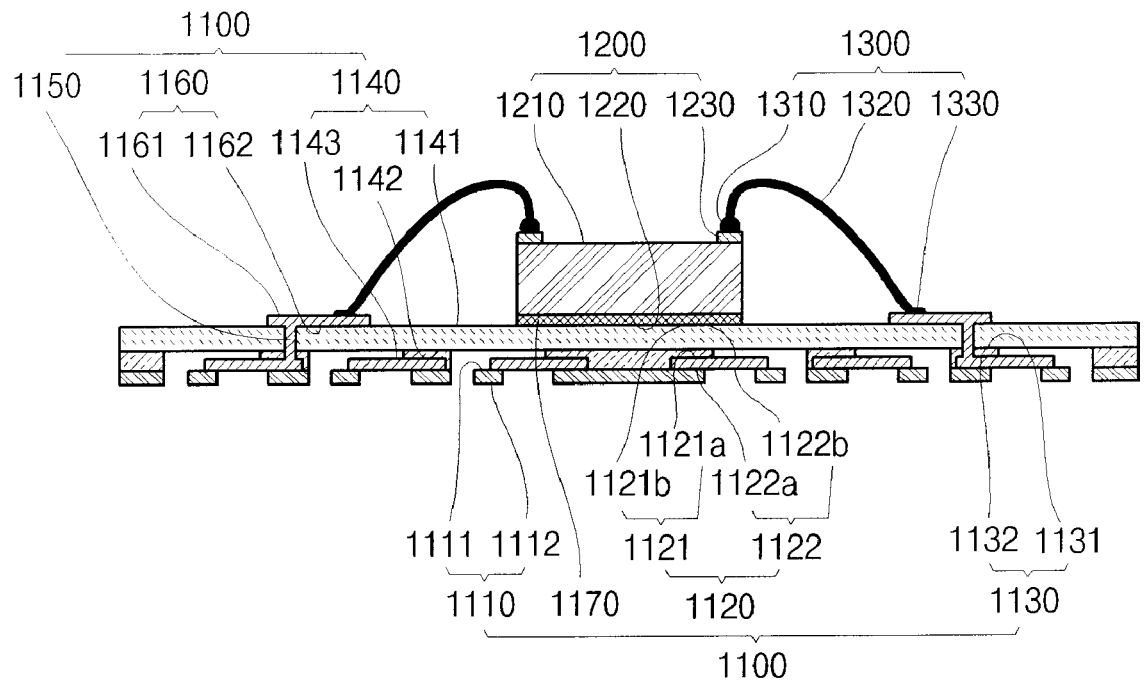

As shown in FIG. 10I, a process to electrically connect the electrically conductive pattern 1160 to the semiconductor die 1200 is done. The electrically connecting member 1300 is used for electrically connecting the bond pad 1230 of the semiconductor die 1200 to the electrically conductive pattern 1160. Also, in the semiconductor package 1000 according to an embodiment of the present invention, a wire is used as the electrically connecting member 1300. The method of connecting the wire may use a forward folded loop mode in a manner of forming a ball bonding portion 1310 and forming a stitch bonding portion 1330 on the other end. Also, although not shown, a reverse loop mode where after forming the ball bonding portion on the electrically conductive pattern 1160, a stitch bonding portion is formed on the bond pad 1223 of the semiconductor die 1200, may be used. But, the method of connecting the electrically connecting member 1300 is not limited to the above methods. Other methods may be used without departing from the spirit and scope of the present invention.

Figure 10J:
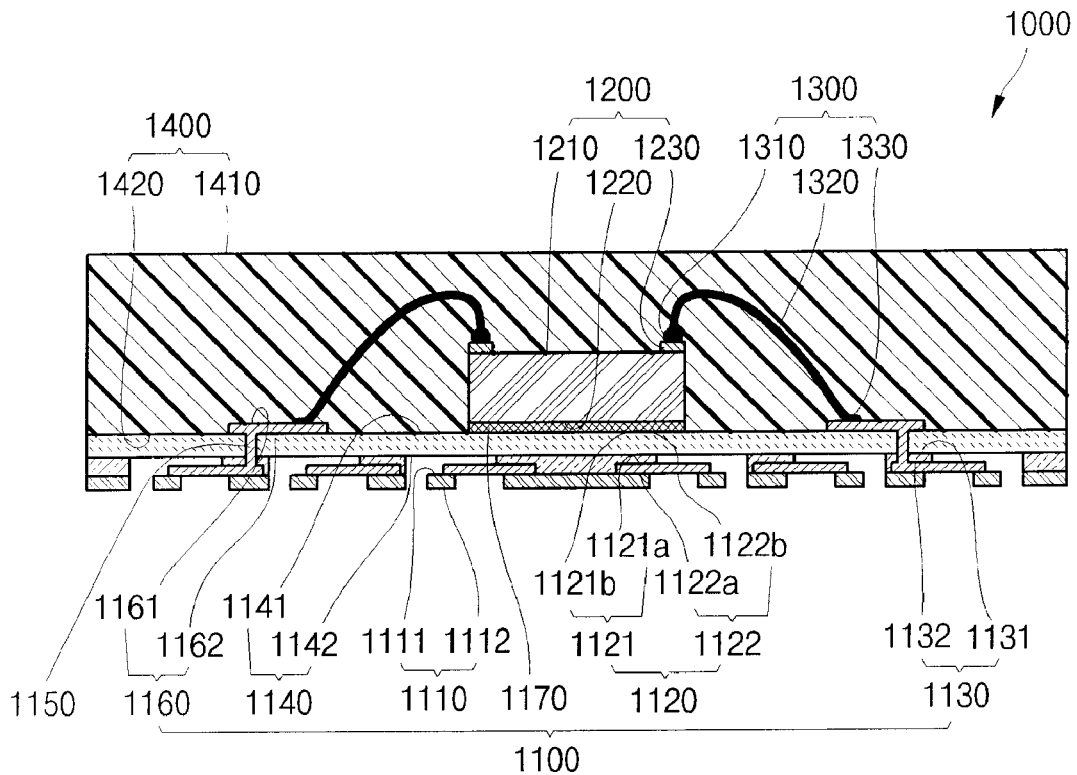

Subsequently, as shown in FIG. 10J, the encapsulant 1400 encapsulates the first surface 1141 of the second insulative layer 1140, the first surface 1161 of the electrically conductive pattern 1160, and the first surface 1210 of the semiconductor die 1200. As shown in FIG. 10J, the encapsulant 1400 is formed by including the semiconductor die 1200 and the electrically connecting member 1300 in the inside thereof. The material of the encapsulant 1400 may be any one selected from common epoxy resin, silicone resin, or the equivalent thereof, but the material of the encapsulant 1400 is not limited in the present invention. Also, FIG. 10J shows that when forming the encapsulant 1400, the encapsulant 1400 is formed in the top of the semiconductor package 1000. However, in the actual process, the encapsulant 1400 is injected in a state where the substrate is positioned so that the semiconductor die 1200 is put in the lower portion.

Figure 10K:
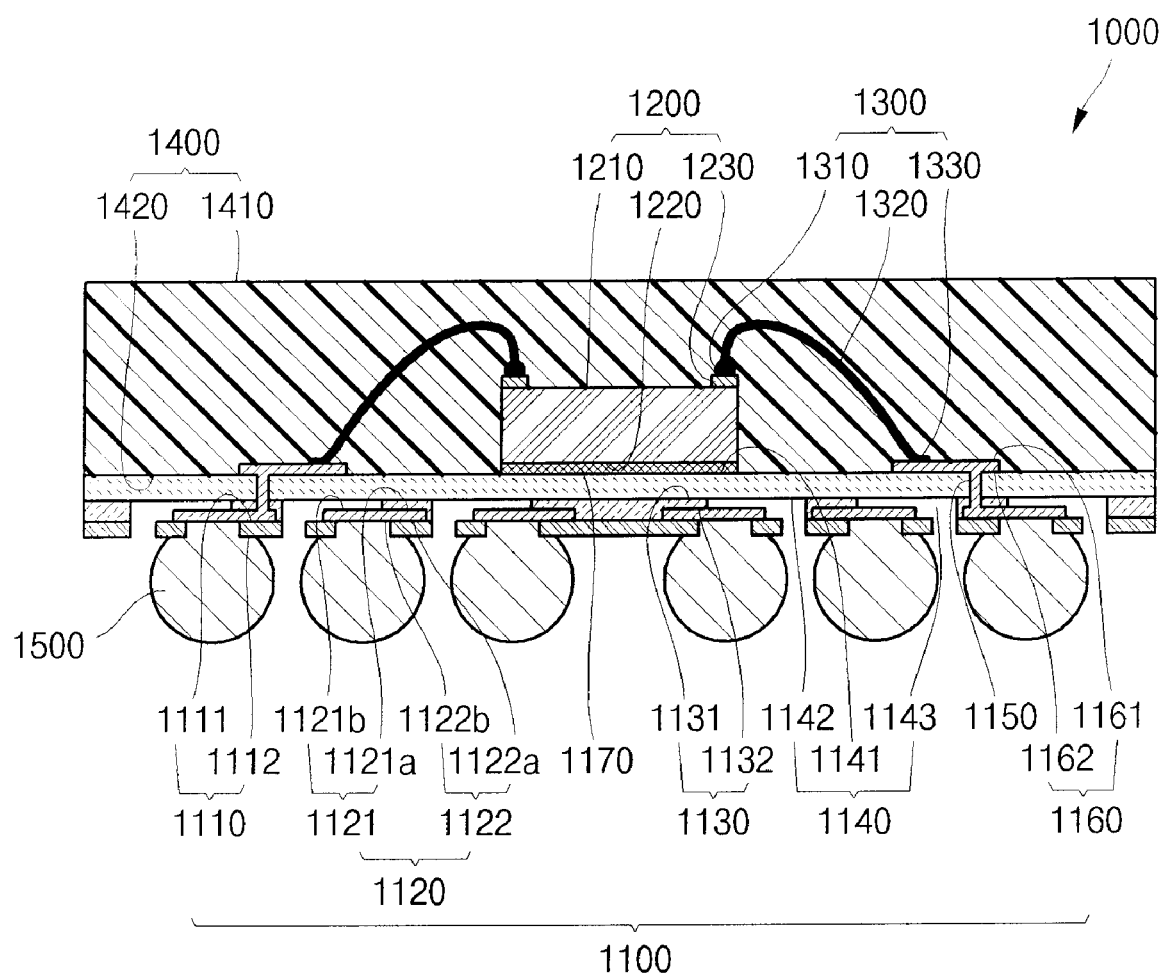

Subsequently, as shown in FIG. 10K, the solder ball 1500 is coupled to the electrically conductive portion 1122b on the second surface 1122 of the land 1120. The solder ball 1500 is the portion electrically coupled to external circuit so that the electrical conductivity thereof should be excellent. The material of the solder ball 1500 may be an alloy of lead (Pb), tin (Sn) or silver (Ag), etc. However, the material of the solder ball 1500 is not limited to those listed above. Other materials may be used without departing from the spirit and scope of the present invention.

As shown in FIG. 10L, the semiconductor package 1000 further including the solder ball 1500, is illustrated. In comparison with FIGS. 10K and 10L, since the solder ball 1500 is formed in the lower of the substrate 1100, the floating area 1121b of the land 120 is downwardly bent. In other words, when the semiconductor package 1000 is applied with the thermal and mechanical stress from outside, the floating area 1121b of the land 1120 can be freely deformed. Consequently, the semiconductor package 1000 can protect the breakage of the land due to the thermal and mechanical stress as described above.

The semiconductor package 1000 can be fabricated as described above. The semiconductor package 1000, includes the floating area 1121b where the land is formed with a predetermined space 1143 in the second insulative layer 1140. Consequently, when the thermal and mechanical stress is applied from outside, the floating area 1121b can be freely deformed to absorb the stress, making it possible to prevent the breakage of the land 1120.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising:
   a substrate having conductive patterns formed thereon;
   a semiconductor die attached to the substrate;
   a conductive member electrically connecting the semiconductor die to the conductive patterns;
   a plurality of lands coupled to the substrate, at least one land is pivotally mounted to the substrate, wherein a first section of the pivotally mounted land is in contact with the substrate, a second section of the pivotally mounted land floating to form a void area between the substrate and the second section;
   an encapsulant for encapsulating a top surface of the substrate, the semiconductor die, and the conductive member; and
   a contact electrically coupled to each land;
   wherein the substrate comprises:
   a first insulative layer, the first insulative layer having the plurality of lands formed thereon;
   a second insulative layer, the second insulative layer having the conductive patterns formed thereon, the semiconductor die attached to the second insulative layer; and
   an adhesive layer formed on the first section of the pivotally mounted land to attach the first section to the second insulative layer, the second section of the pivotally mounted land floating to form the void area between the second insulative layer and the second section.

2. The semiconductor package according to claim 1, further comprising at least one via formed through the substrate to couple the pivotally mounted land to the semiconductor die through the conductive patterns.

3. The semiconductor package according to claim 1, further comprising:
   a plurality of contacts;
   wherein the first insulative layer has a first surface attached to the plurality of lands, the plurality of contacts attached to a second surface of the land to sections of the plurality of lands exposed through the first insulative layer.

4. The semiconductor package according to claim 3, wherein the adhesive layer is a UV adhesive.

5. The semiconductor package according to claim 1, wherein the second section of the pivotally mounted land floating to form a void area between the substrate and the second section is approximately 30% to 80% of an area of the pivotally mounted land.

6. The semiconductor package according to claim 1, wherein the electrically connecting member is a metal wire that is electrically coupled to the semiconductor die and the conductive patterns.

7. The semiconductor package according to claim 1, wherein the conductive member is a plurality of contacts that is electrically coupled to the semiconductor die and the conductive patterns.

8. The semiconductor package according to claim 7, further comprising an underfill formed between the substrate and contacts electrically coupled to the semiconductor die.

9. A semiconductor package comprising:
a substrate having conductive patterns formed thereon;
a semiconductor die electrically coupled to the substrate;
a plurality of lands coupled to the substrate, at least one land is pivotally mounted to the substrate, wherein a first section of the pivotally mounted land is in contact with the substrate, a second section of the pivotally mounted land floating to form a void area between the substrate and the second section; and
an encapsulant for encapsulating a top surface of the substrate and the semiconductor die;
wherein the substrate comprises:
a first insulative layer, the first insulative layer having the plurality of lands formed thereon;
a second insulative layer, the second insulative layer having the conductive patterns formed thereon, the semiconductor die attached to the second insulative layer; and
an adhesive layer formed on the first section of the pivotally mounted land to attach the first section to the second insulative layer, the second section of the pivotally mounted land floating to form the void area between the second insulative layer and the second section.

10. The semiconductor package according to claim 9, further comprising a contact electrically coupled to each land exposed through the first insulative layer.

11. The semiconductor package according to claim 9, further comprising at least one via formed through the substrate to couple the pivotally mounted land to the semiconductor die through the conductive patterns.

12. The semiconductor package according to claim 9, wherein the second section of the pivotally mounted land floating to form a void area between the substrate and the second section is approximately 30% to 80% of an area of the pivotally mounted land.

13. The semiconductor package according to claim 9, further comprising a plurality of contacts electrically coupled to the semiconductor die and the conductive patterns.

14. The semiconductor package according to claim 13, further comprising an underfill formed between the substrate and contacts electrically coupled to the semiconductor die.

15. A semiconductor package comprising:
a substrate having a first and second surface;
a semiconductor die electrically attached to the first surface of the substrate;
means pivotally mounted to the second surface of the substrate for electrically coupling contacts to the semiconductor package, wherein a first section of the means is in contact with the substrate, a second section of the means floating to form a void area between the substrate and the second section; and
an encapsulant for encapsulating a top surface of the substrate and the semiconductor die;
wherein the substrate comprises:
a first insulative layer, the first insulative layer having the plurality of lands formed thereon;
a second insulative layer, the second insulative layer having the conductive patterns formed thereon, the semiconductor die attached to the second insulative layer; and
an adhesive layer formed on the first section of the pivotally mounted land to attach the first section to the second insulative layer, the second section of the pivotally mounted land floating to form the void area between the second insulative layer and the second section.

16. The semiconductor package according to claim 15, further comprising a contact electrically coupled to each means.

* * * * *